United States Patent
Liu et al.

(10) Patent No.: US 10,050,116 B2
(45) Date of Patent: Aug. 14, 2018

(54) SEMICONDUCTOR DEVICE STRUCTURE AND METHOD FOR FORMING THE SAME

(71) Applicant: Taiwan Semiconductor Manufacturing Company, Ltd., Hsinchu (TW)

(72) Inventors: Hsiao-Ping Liu, Hsinchu (TW); Hung-Chang Hsu, Kaohsiung (TW); Hung-Wen Su, Jhubei (TW); Ming-Hsing Tsai, Chu-Pei (TW); Rueijer Lin, Hsinchu (TW); Sheng-Hsuan Lin, Zhubei (TW); Ya-Lien Lee, Baoshan Township (TW); Yen-Shou Kao, Taichung (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 0 days.

(21) Appl. No.: 15/785,780

(22) Filed: Oct. 17, 2017

(65) Prior Publication Data
US 2018/0040705 A1 Feb. 8, 2018

Related U.S. Application Data

(62) Division of application No. 14/990,009, filed on Jan. 7, 2016, now Pat. No. 9,818,834.

(51) Int. Cl.
*H01L 21/311* (2006.01)
*H01L 21/02* (2006.01)
(Continued)

(52) U.S. Cl.
CPC ...... *H01L 29/456* (2013.01); *H01L 21/31111* (2013.01); *H01L 21/31116* (2013.01);
(Continued)

(58) Field of Classification Search
CPC .......... H01L 29/6656; H01L 21/76843; H01L 21/76855; H01L 21/31055; H01L 21/768; H01L 21/76802; H01L 21/823462
(Continued)

(56) References Cited

U.S. PATENT DOCUMENTS 6,376,888 B1  4/2002  Tsunashima et al.
6,607,955 B2 * 8/2003  Lee ................... H01L 21/32139
                                                    257/E21.314
(Continued)

FOREIGN PATENT DOCUMENTS

TW        I225686 B    12/2004

*Primary Examiner* — Jonathan Han
(74) *Attorney, Agent, or Firm* — Slater Matsil, LLP

(57) ABSTRACT

A method for forming a semiconductor device structure is provided. The method includes forming a gate stack, a spacer layer, and a dielectric layer over a substrate. The method includes removing a first portion of the dielectric layer to form a first hole in the dielectric layer. A second portion of the dielectric layer is under the first hole. The method includes forming a first protection layer over the gate stack and the spacer layer. The method includes forming a second protection layer over the first protection layer. The second protection layer includes a metal compound material, and the first protection layer and the second protection layer includes a same metal element. The method includes removing the second portion of the dielectric layer to form a through hole. The method includes forming a conductive contact structure in the through hole.

20 Claims, 30 Drawing Sheets

(51) Int. Cl.
*H01L 29/45* (2006.01)
*H01L 21/768* (2006.01)
*H01L 29/51* (2006.01)

(52) U.S. Cl.
CPC .. *H01L 21/31144* (2013.01); *H01L 21/76804* (2013.01); *H01L 21/76832* (2013.01); *H01L 21/76846* (2013.01); *H01L 21/76856* (2013.01); *H01L 29/511* (2013.01)

(58) Field of Classification Search
USPC ......... 257/288, E21.585, 347; 438/427, 430, 438/700; 216/39
See application file for complete search history.

(56) References Cited

U.S. PATENT DOCUMENTS

| | | | |
|---|---|---|---|
| 8,735,280 B1 | 5/2014 | Yeh et al. | |
| 8,927,407 B2* | 1/2015 | Baars | H01L 21/76897 257/288 |
| 2005/0136603 A1* | 6/2005 | Iizuka | H01L 21/31111 438/299 |
| 2005/0156229 A1 | 7/2005 | Yeap et al. | |
| 2012/0295441 A1* | 11/2012 | Hong | H01L 21/0337 438/683 |
| 2014/0361364 A1* | 12/2014 | Chen | H01L 29/408 257/336 |

* cited by examiner

SEMICONDUCTOR DEVICE STRUCTURE AND METHOD FOR FORMING THE SAME

PRIORITY CLAIM AND CROSS REFERENCE

This application is a divisional of U.S. patent application Ser. No. 14/990,009, filed Jan. 7, 2016, entitled "Semiconductor Device Structure and Method for Forming the Same," which applications is hereby incorporated herein by reference in its entirety.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

However, although existing semiconductor manufacturing processes have generally been adequate for their intended purposes, as device scaling-down continues, they have not been entirely satisfactory in all respects.

BRIEF DESCRIPTION OF THE DRAWINGS

Aspects of the present disclosure are best understood from the following detailed description when read with the accompanying figures. It should be noted that, in accordance with standard practice in the industry, various features are not drawn to scale. In fact, the dimensions of the various features may be arbitrarily increased or reduced for clarity of discussion.

FIGS. 1A-1 to 1N-1 are cross-sectional views illustrating a semiconductor device structure along a sectional line I-I' in FIGS. 1A-1N respectively, in accordance with some embodiments.

DETAILED DESCRIPTION

Figure 1A:
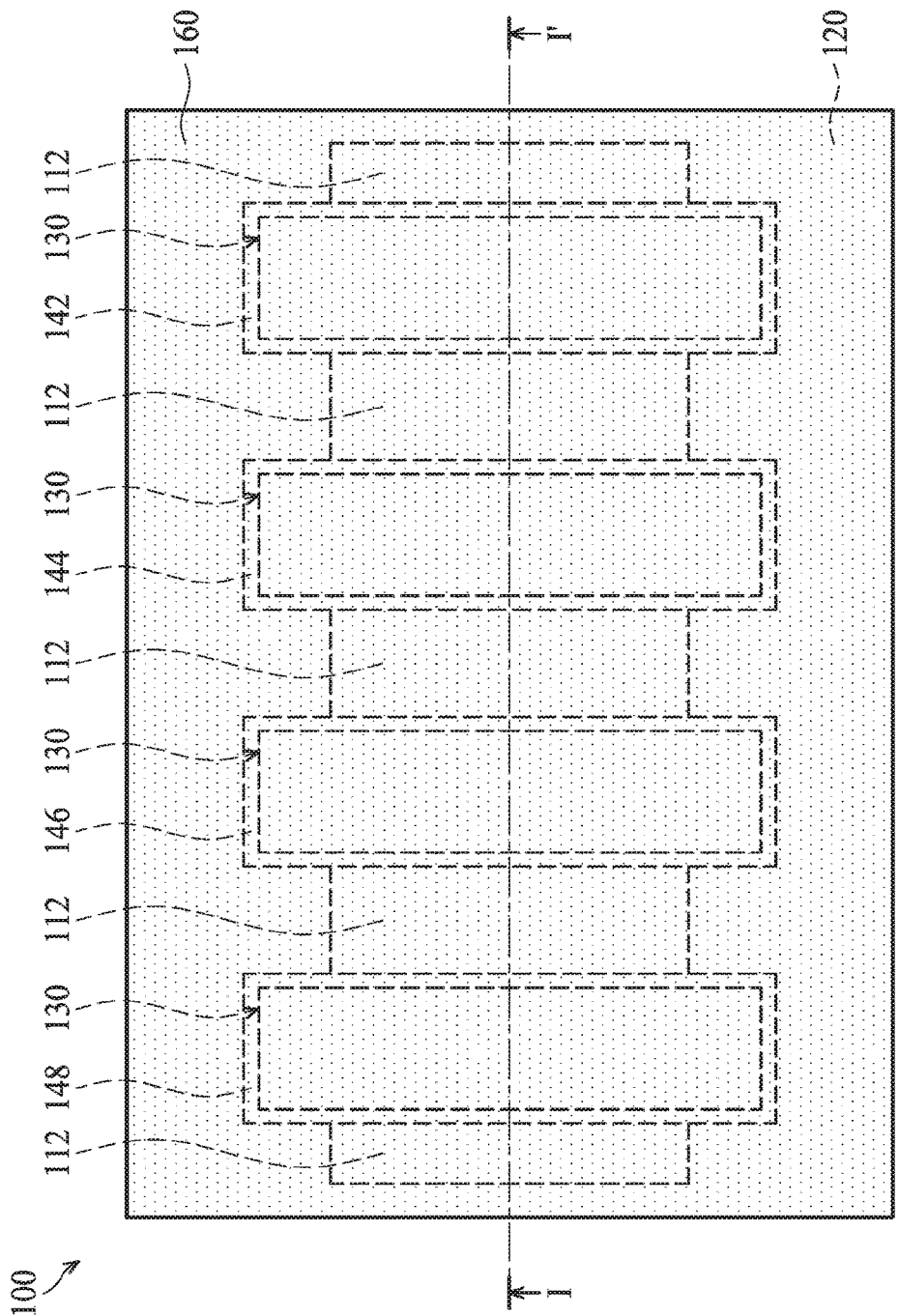
FIGS. 1A-1N are top views of various stages of a process for forming a semiconductor device structure, in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that additional operations can be provided before, during, and after the method, and some of the operations described can be replaced or eliminated for other embodiments of the method.

Figures 1, 1A:
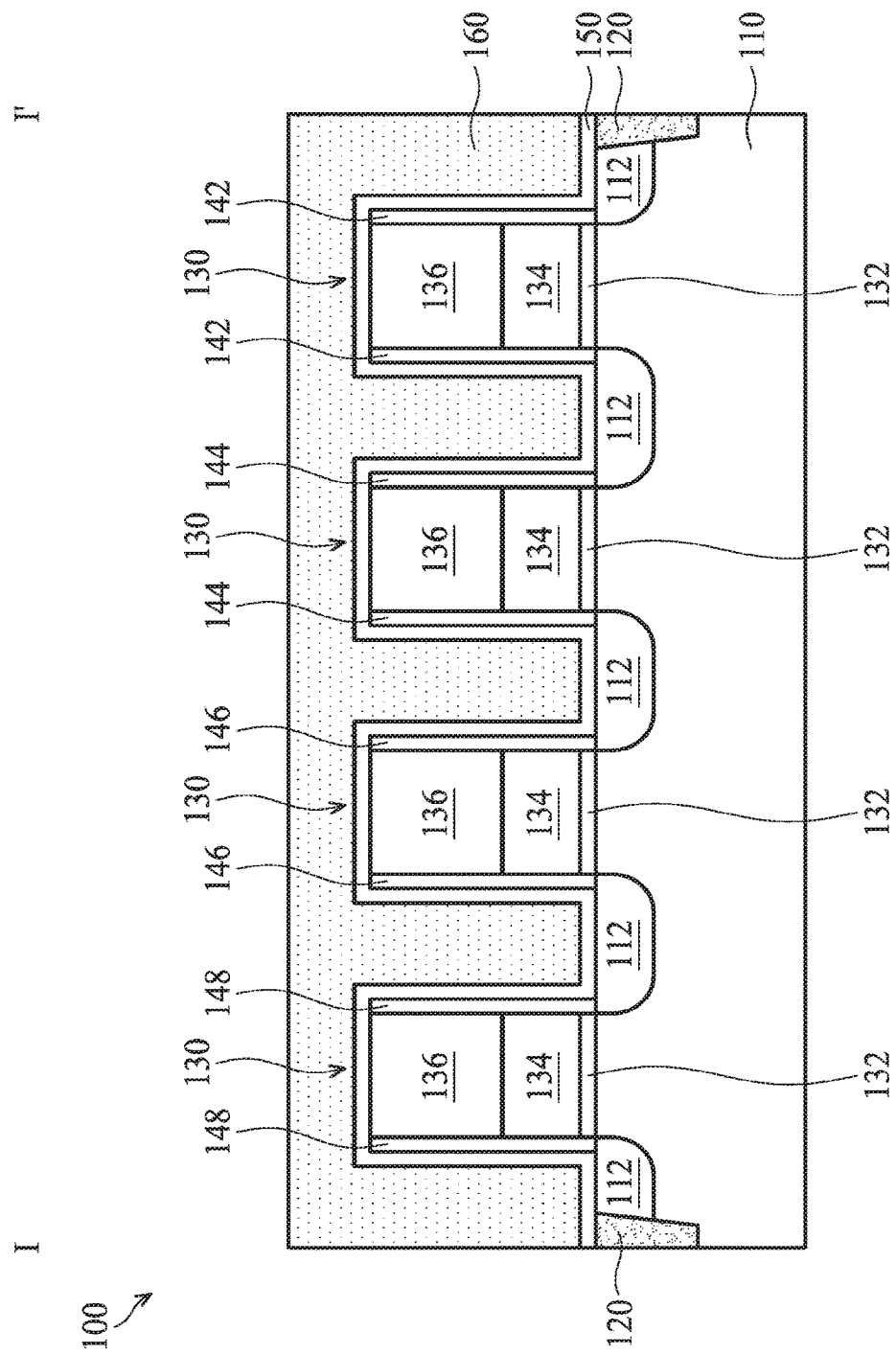
Figure 1B:
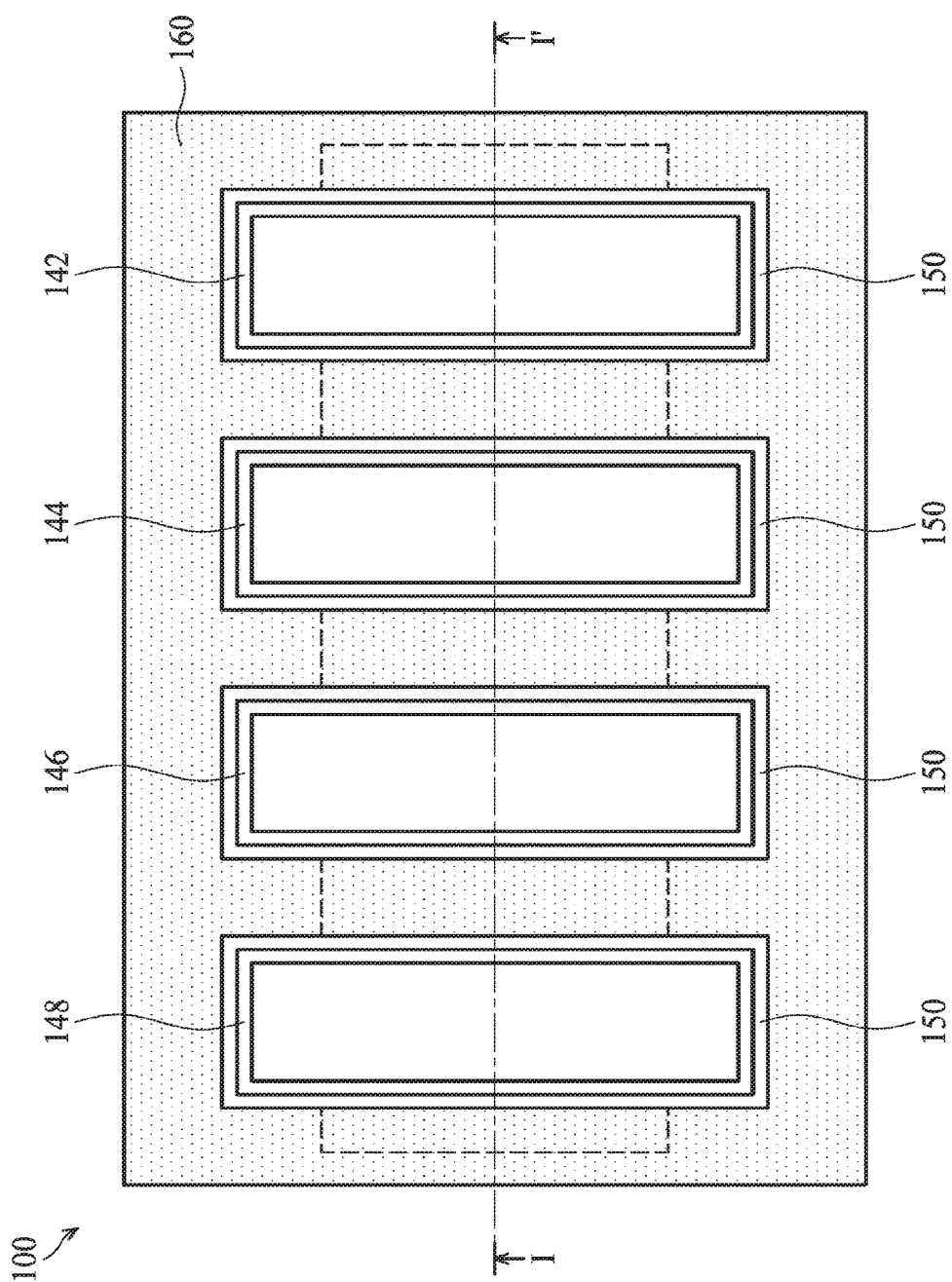
Figures 1, 1B:
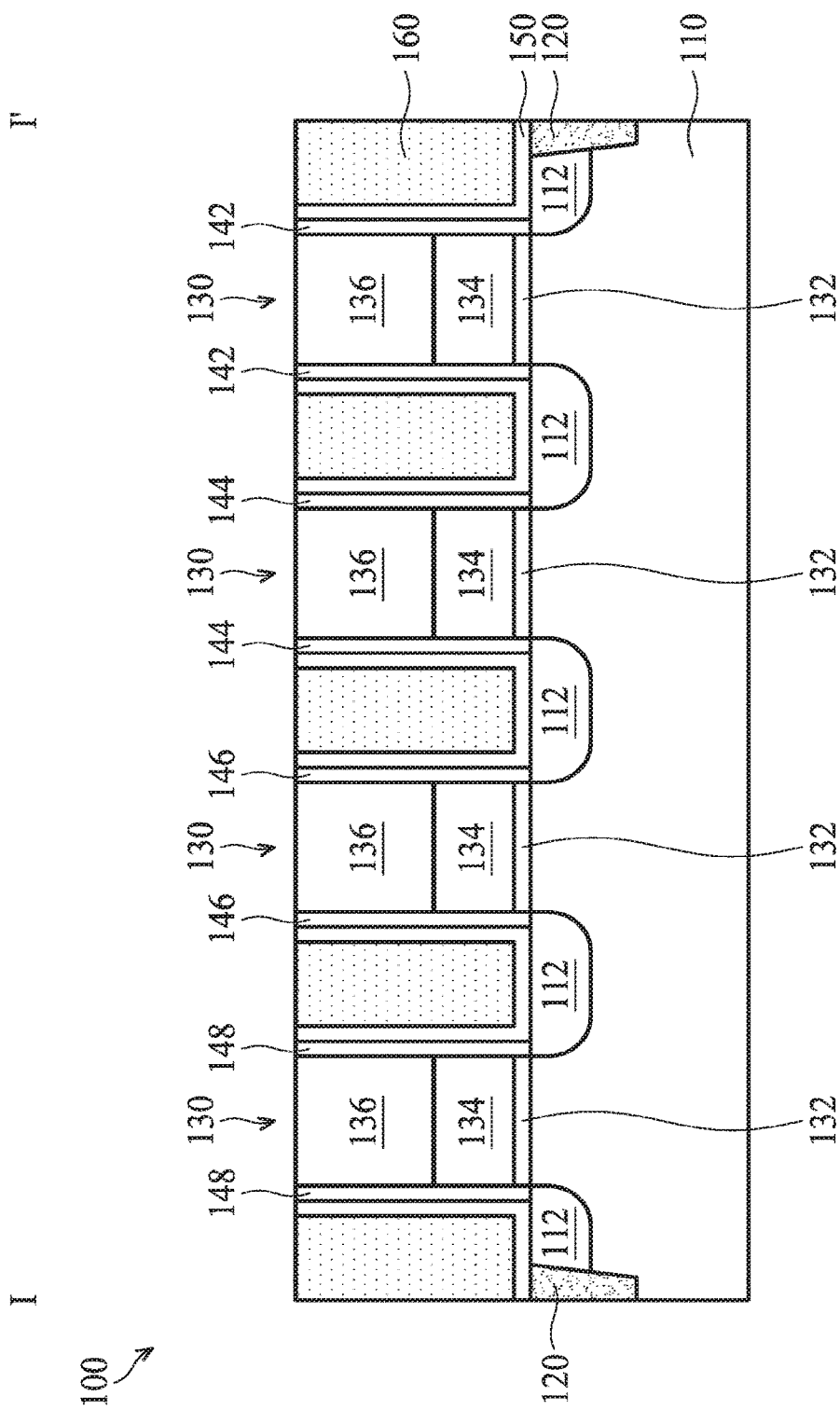
Figure 1C:
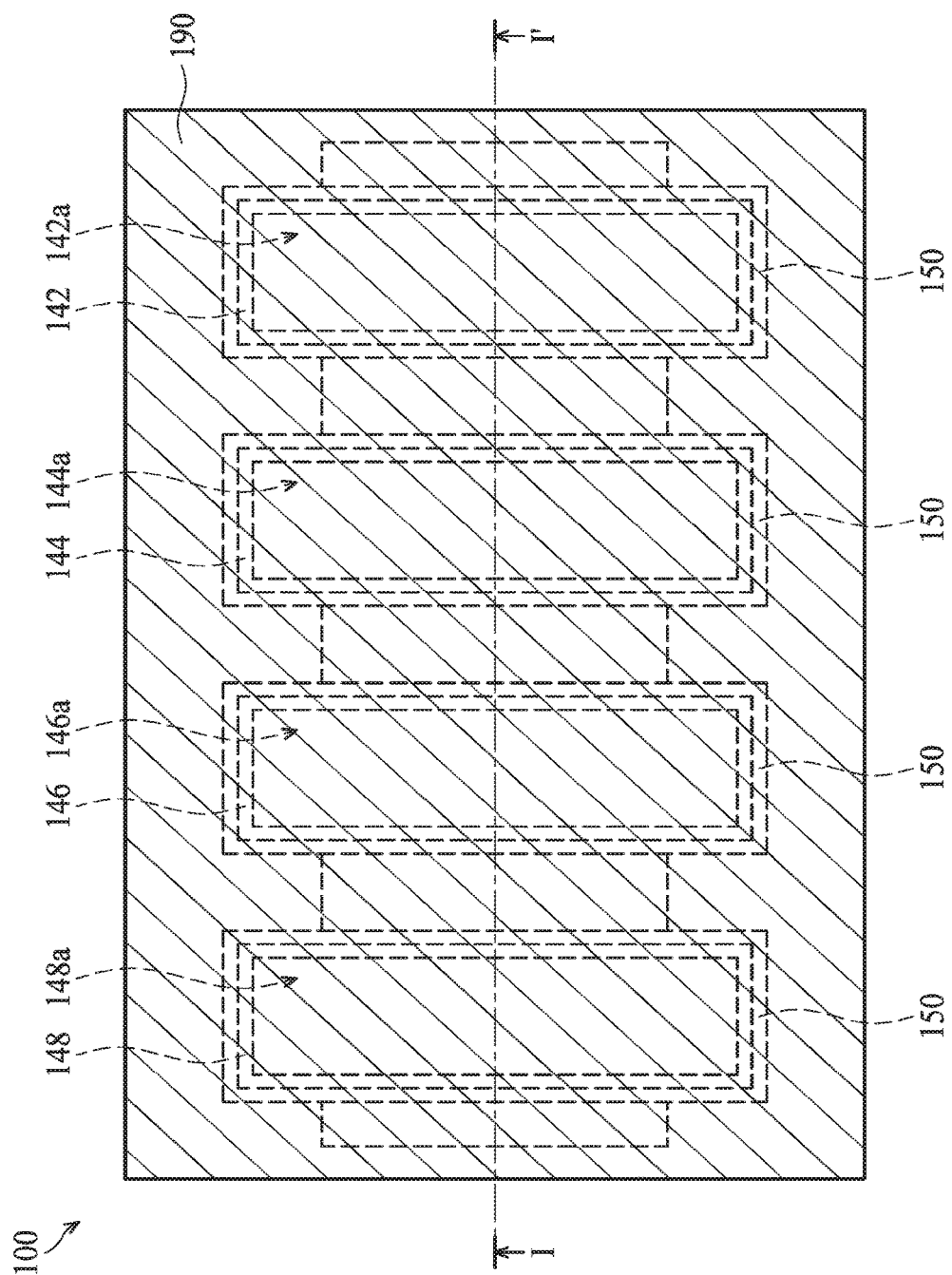
Figures 1, 1C:
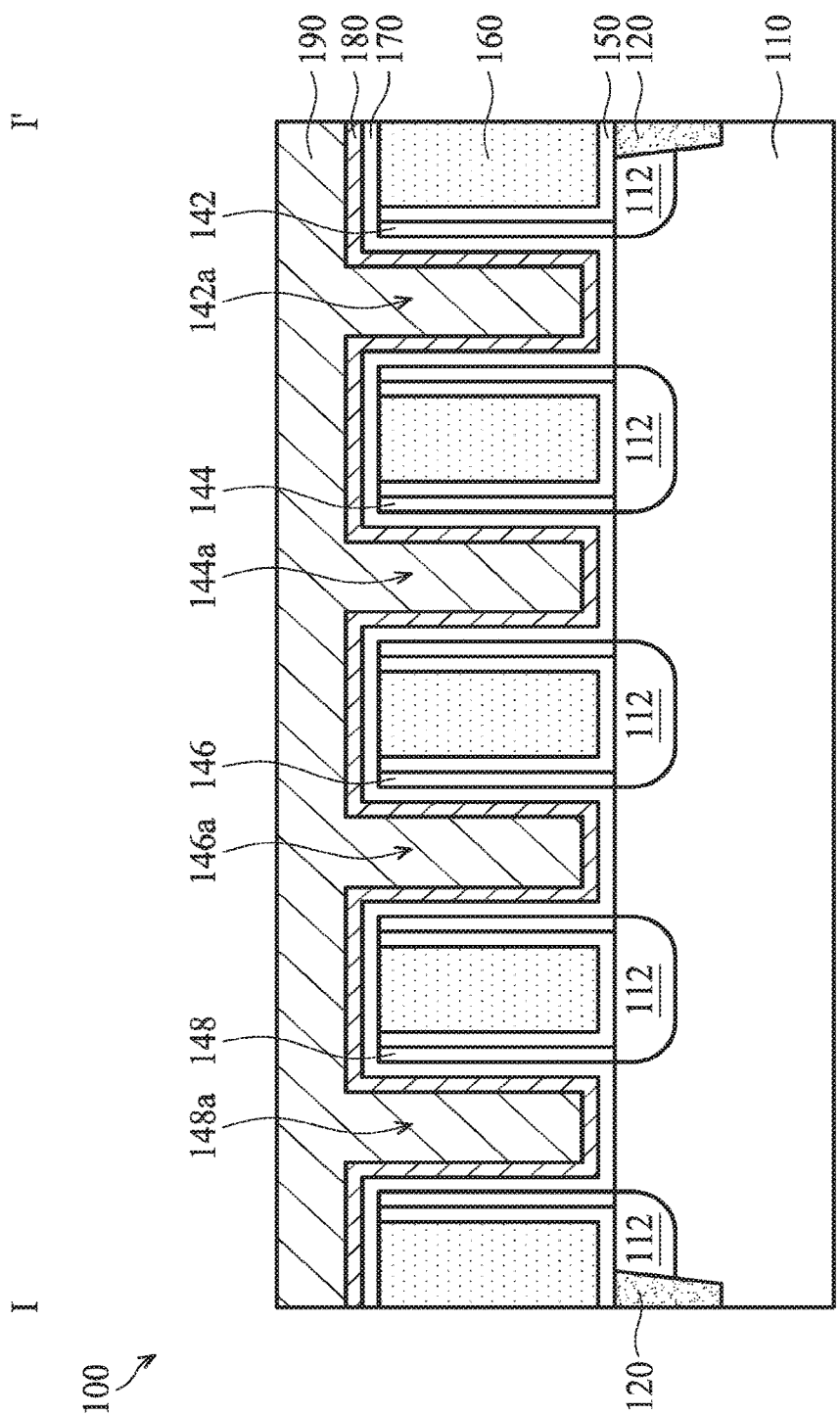
Figure 1D:
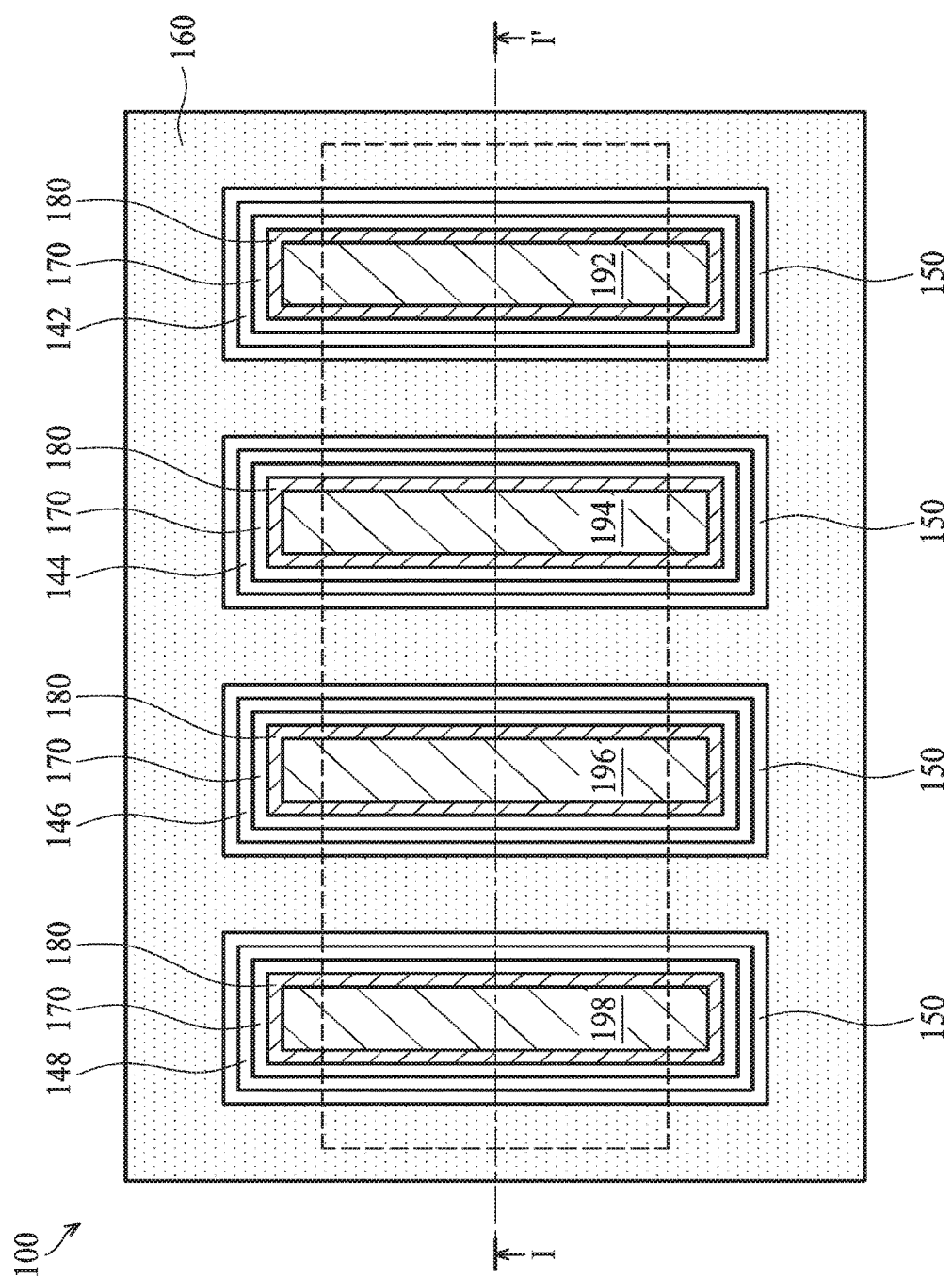
Figures 1, 1D:
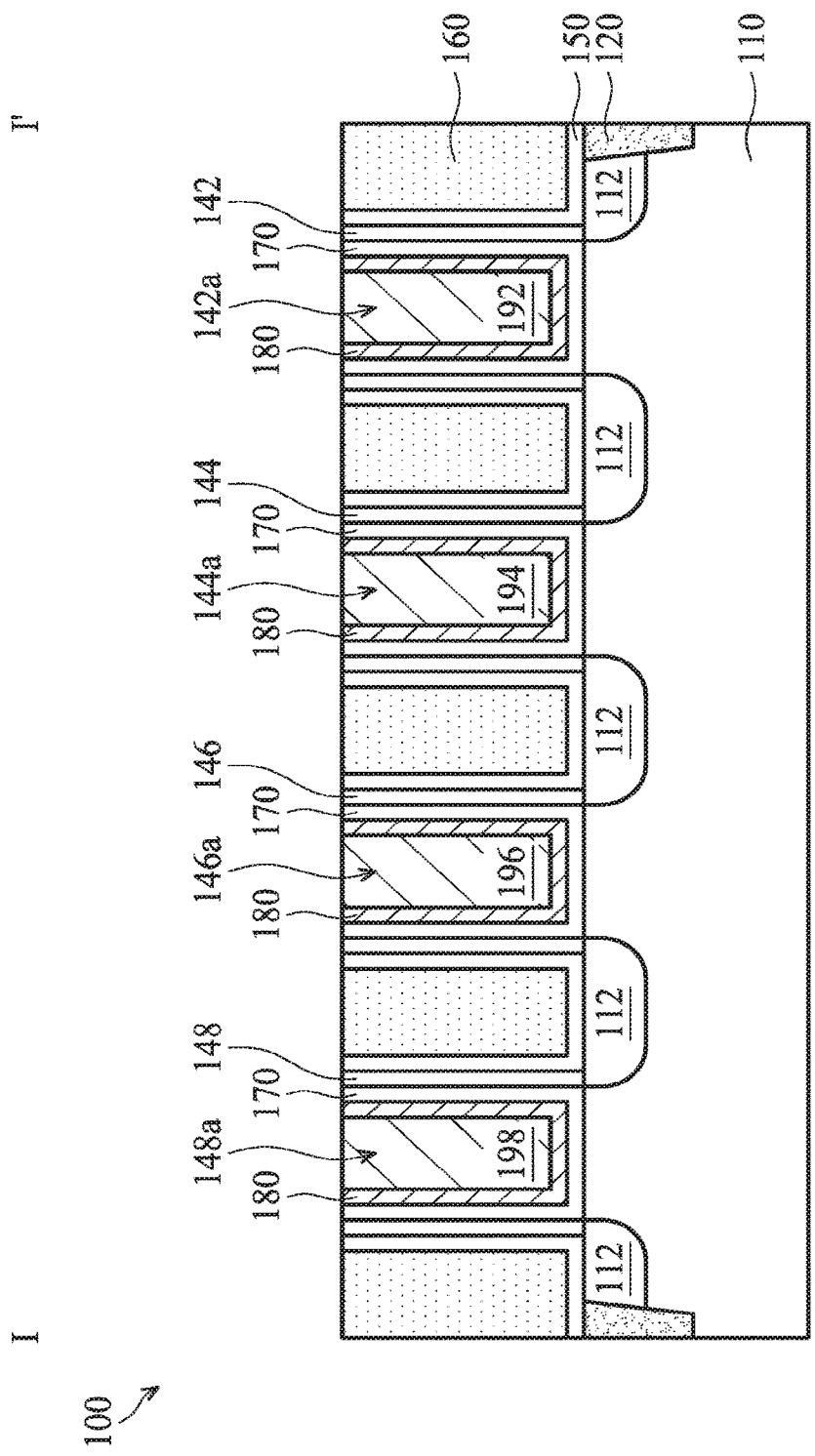
Figure 1E:
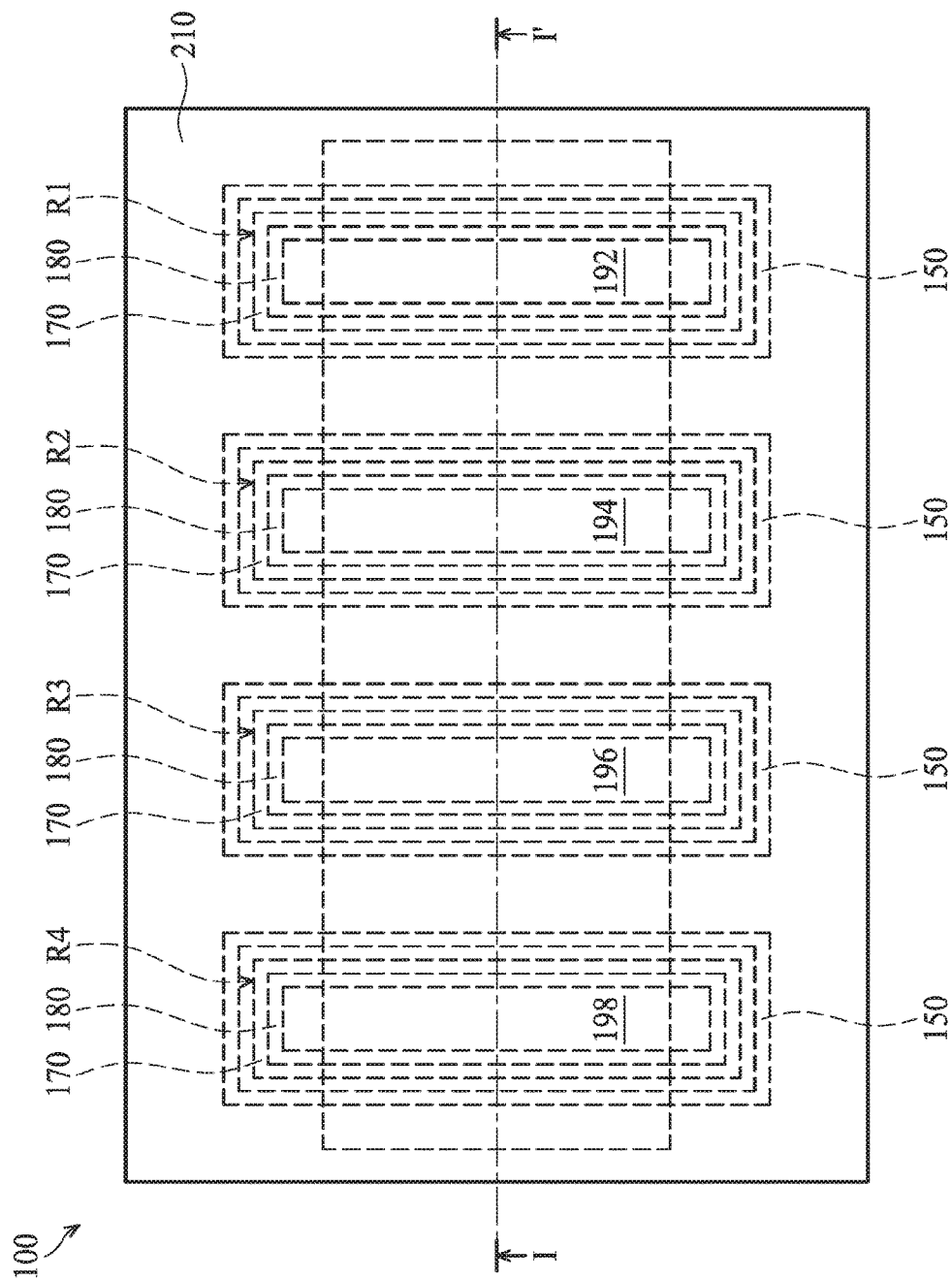
Figures 1, 1E:
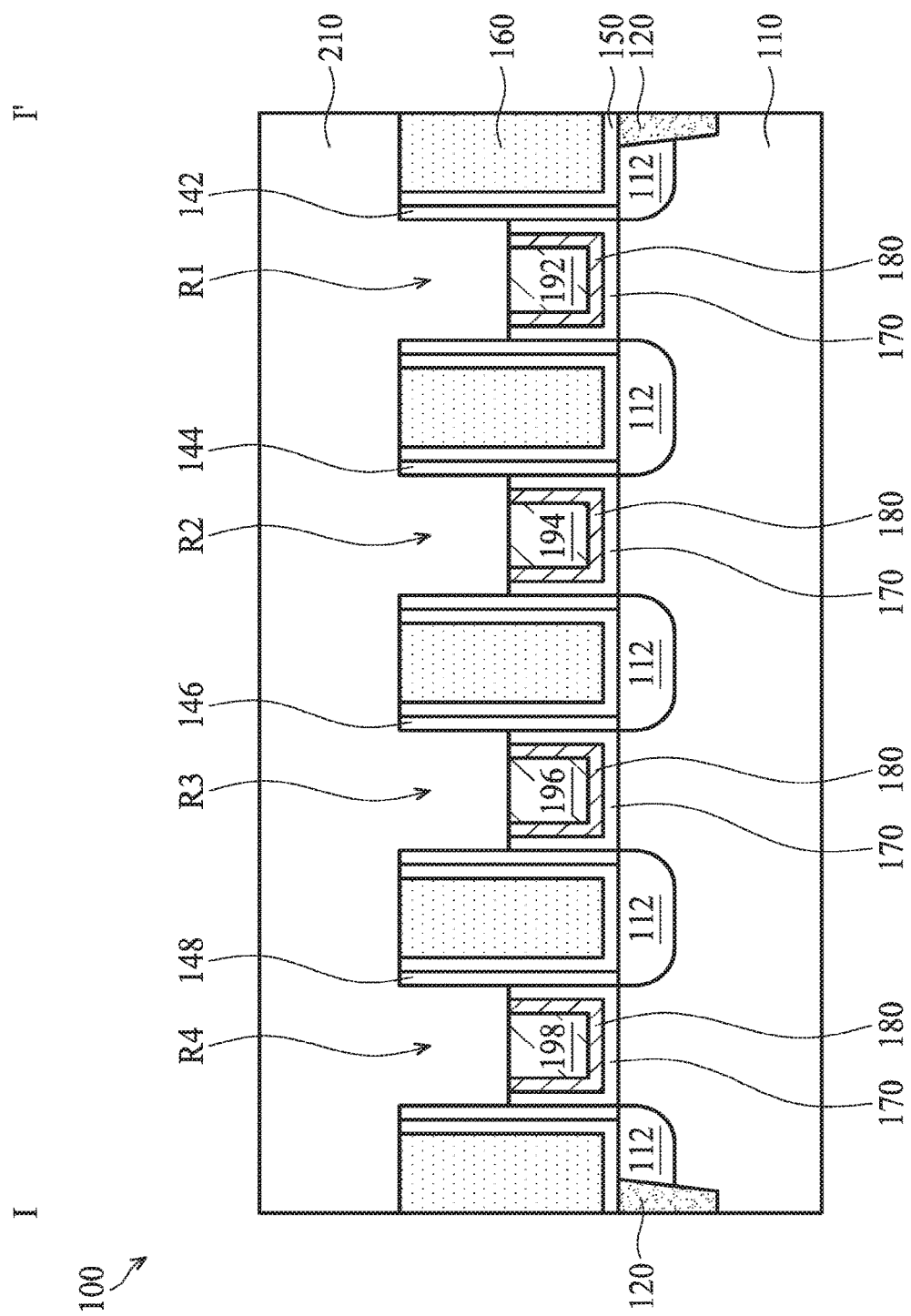
Figure 1F:
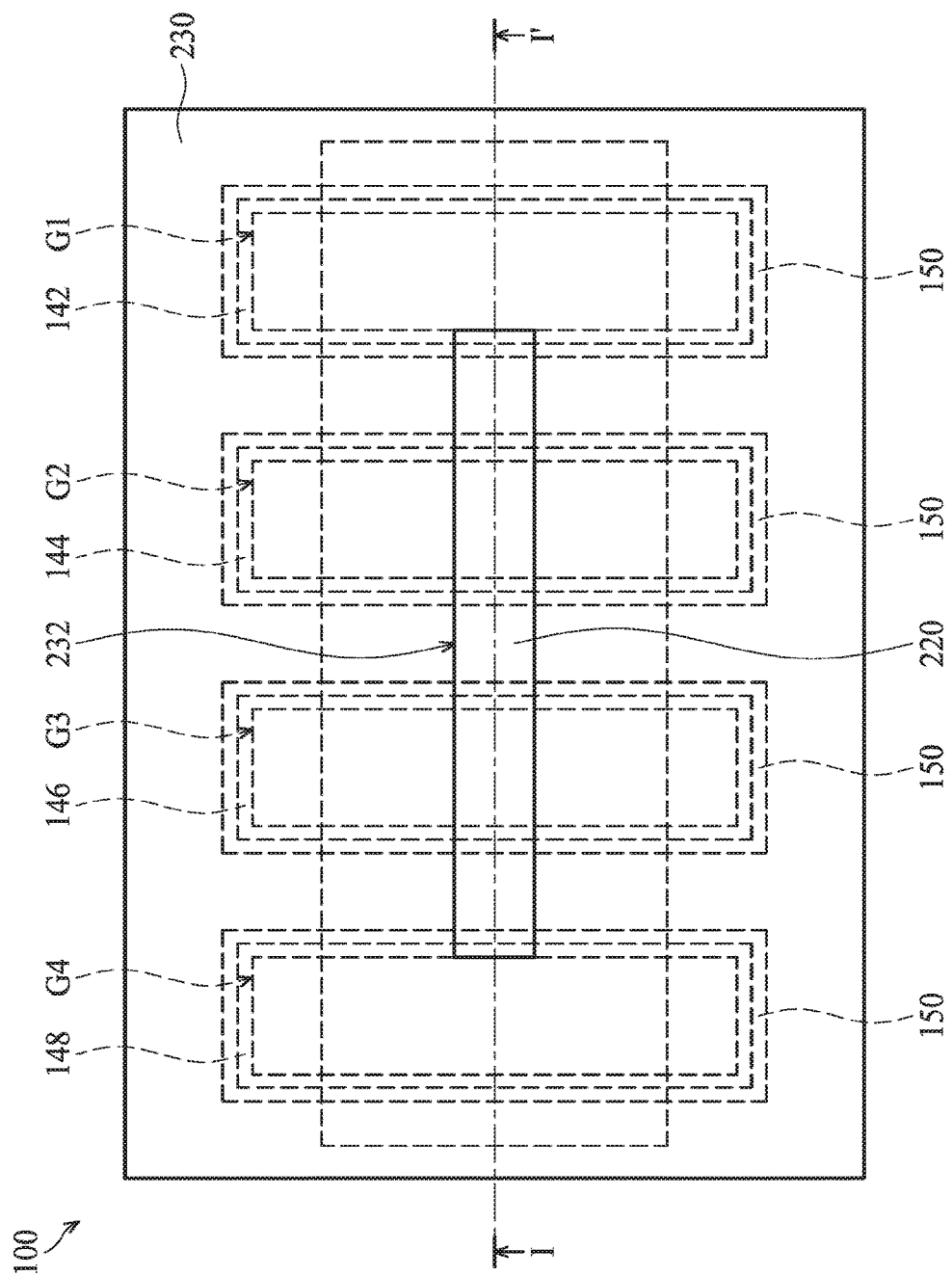
Figures 1, 1F:
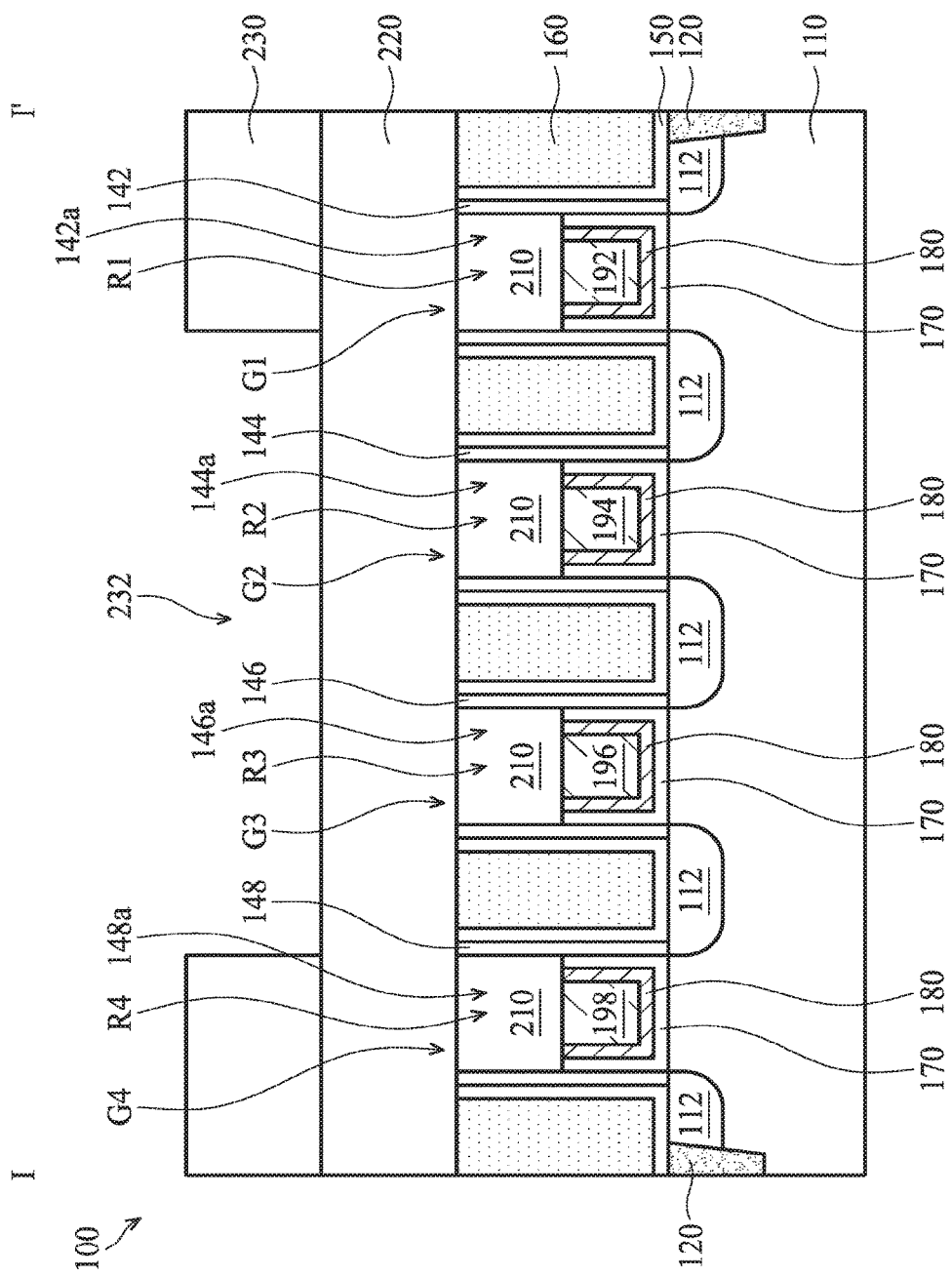
Figure 1G:
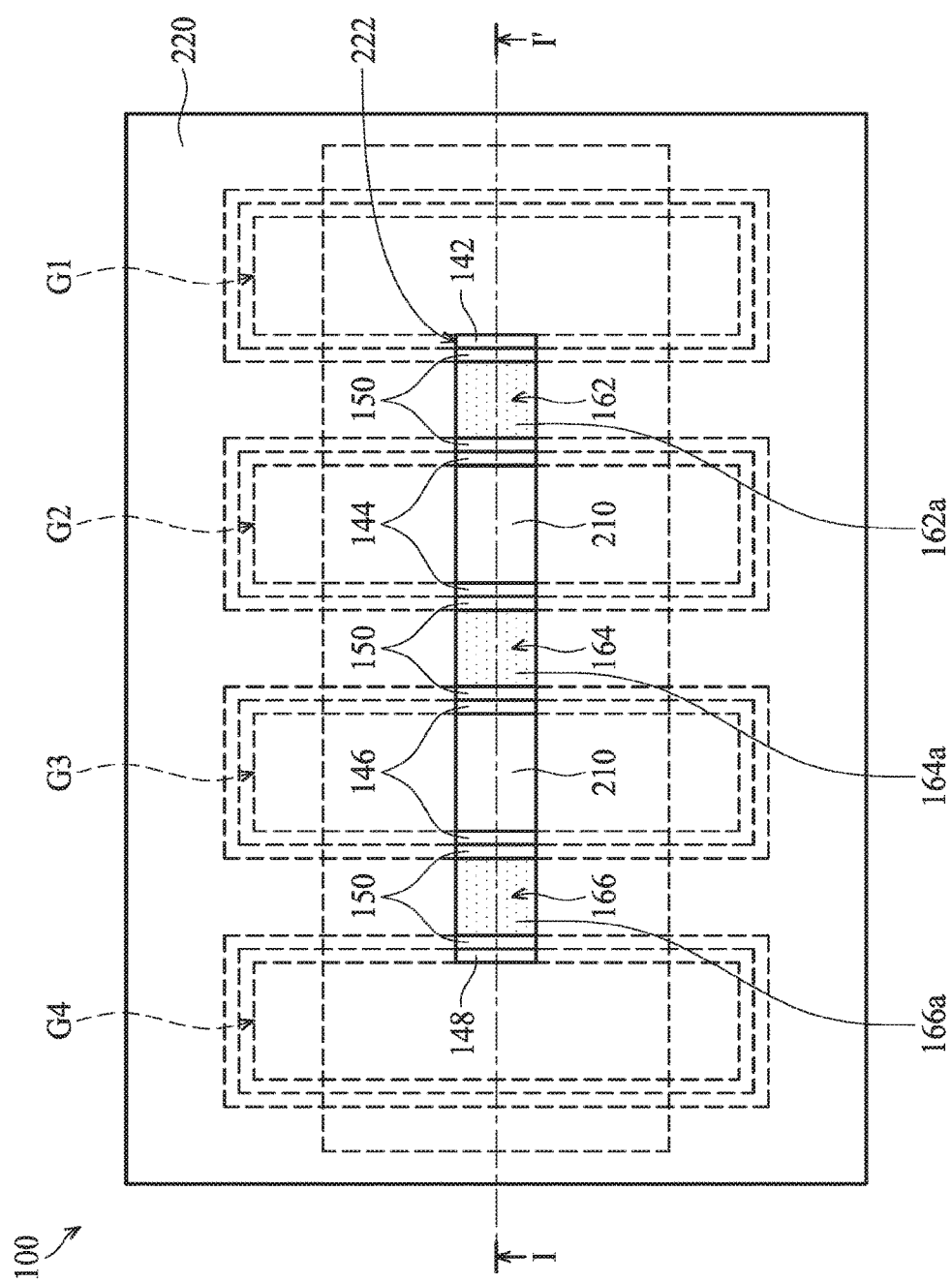
Figures 1, 1G:
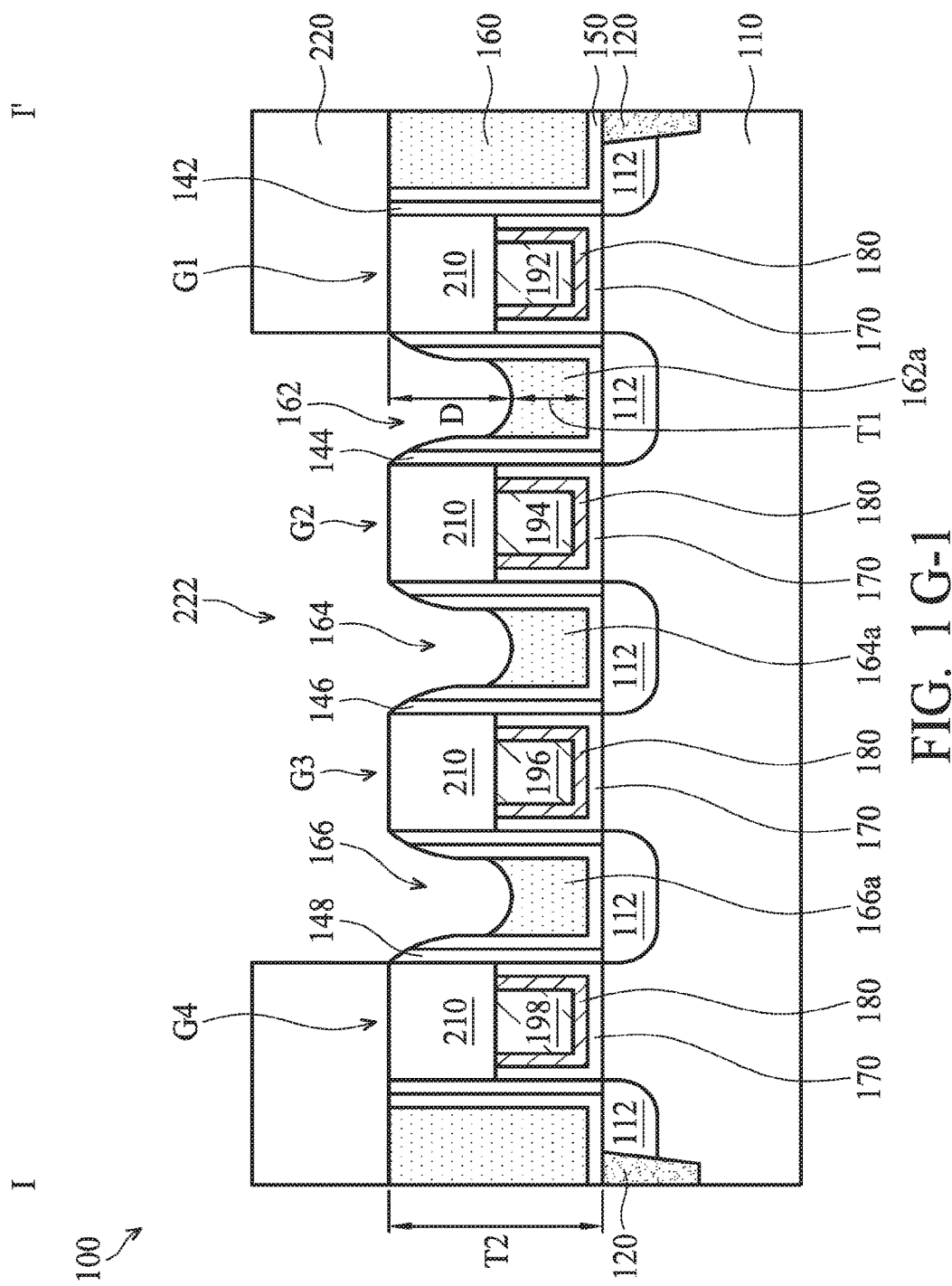
Figure 1H:
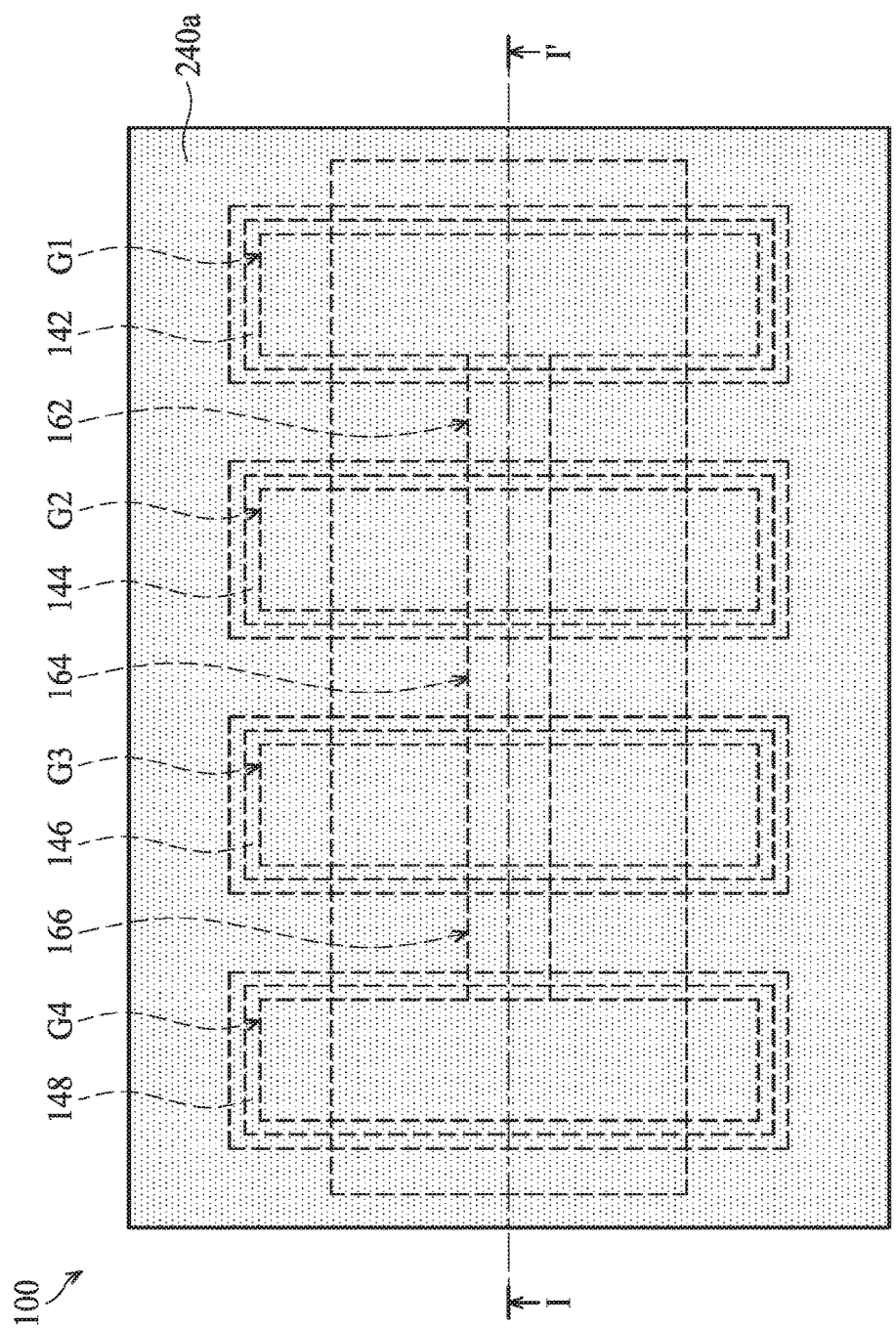
Figures 1, 1H:
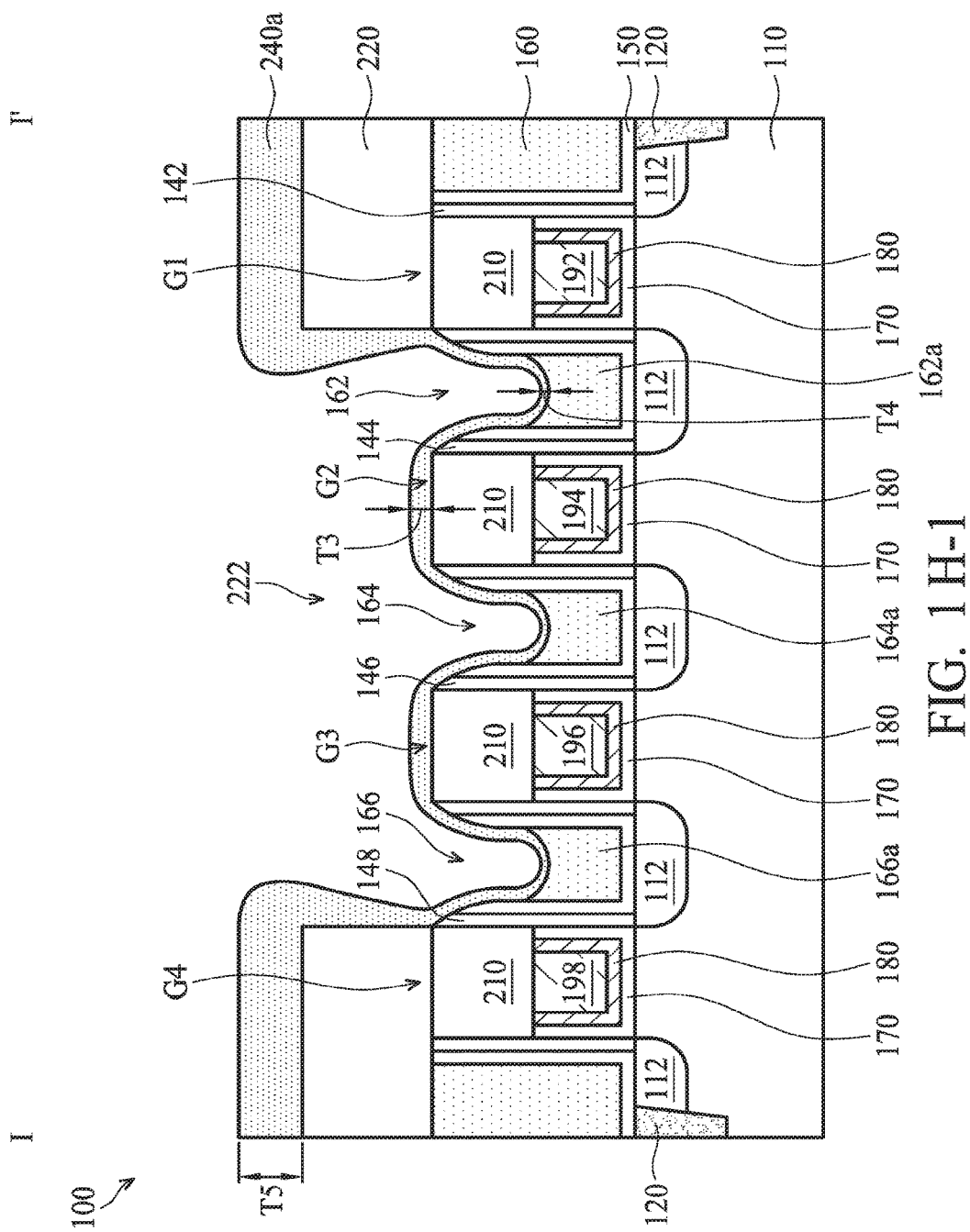
Figure 1I:
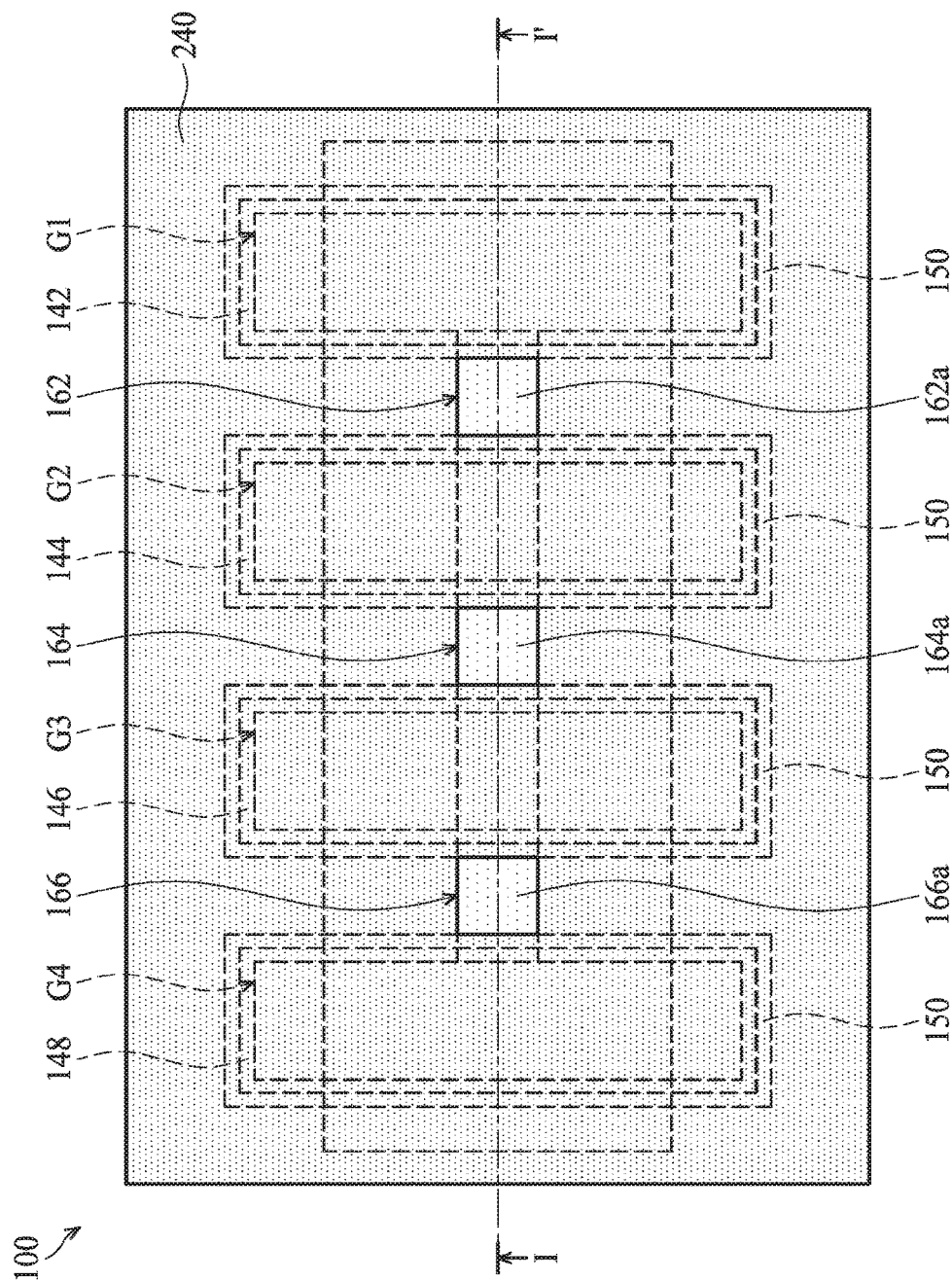
Figures 1, 1I:
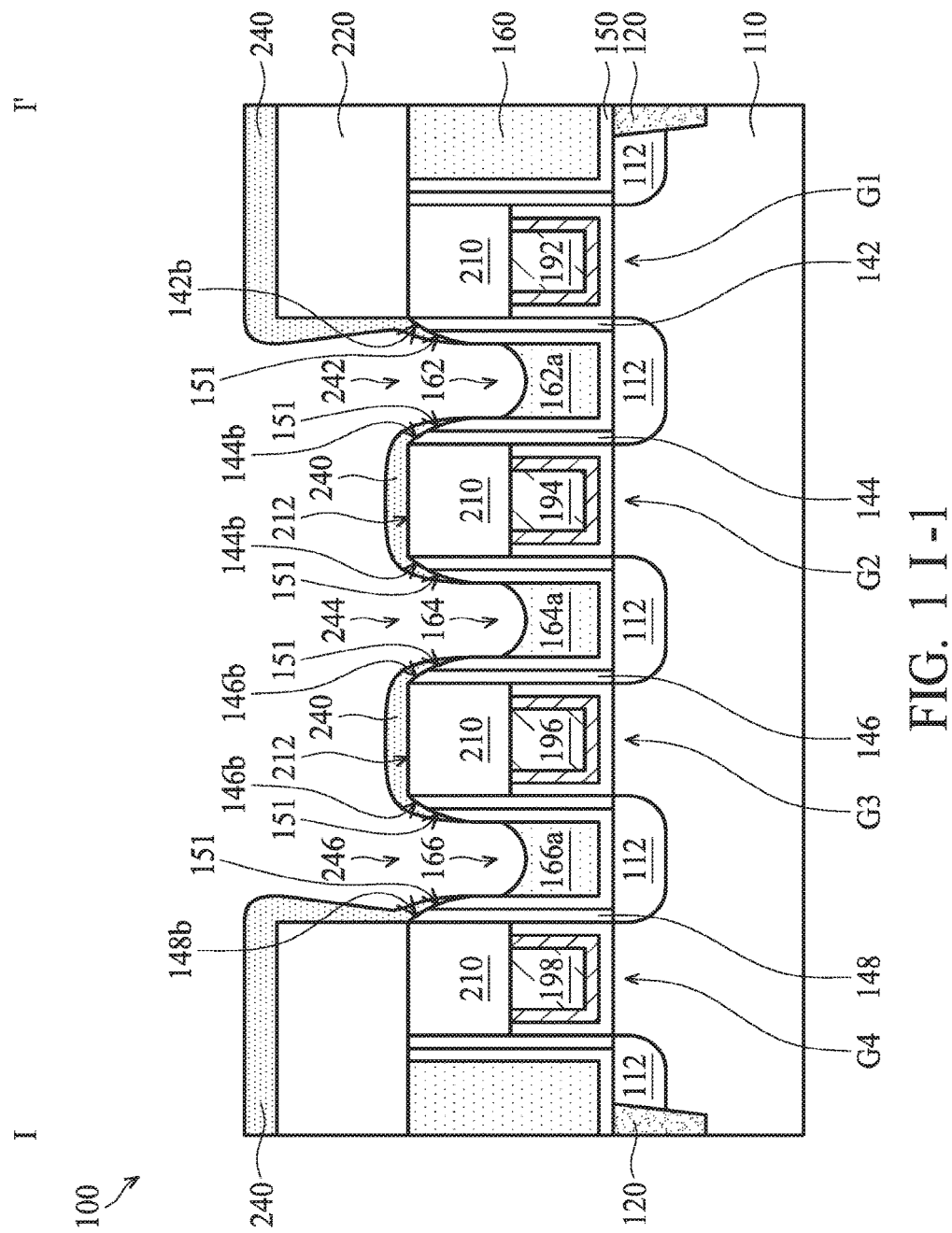
Figure 1J:
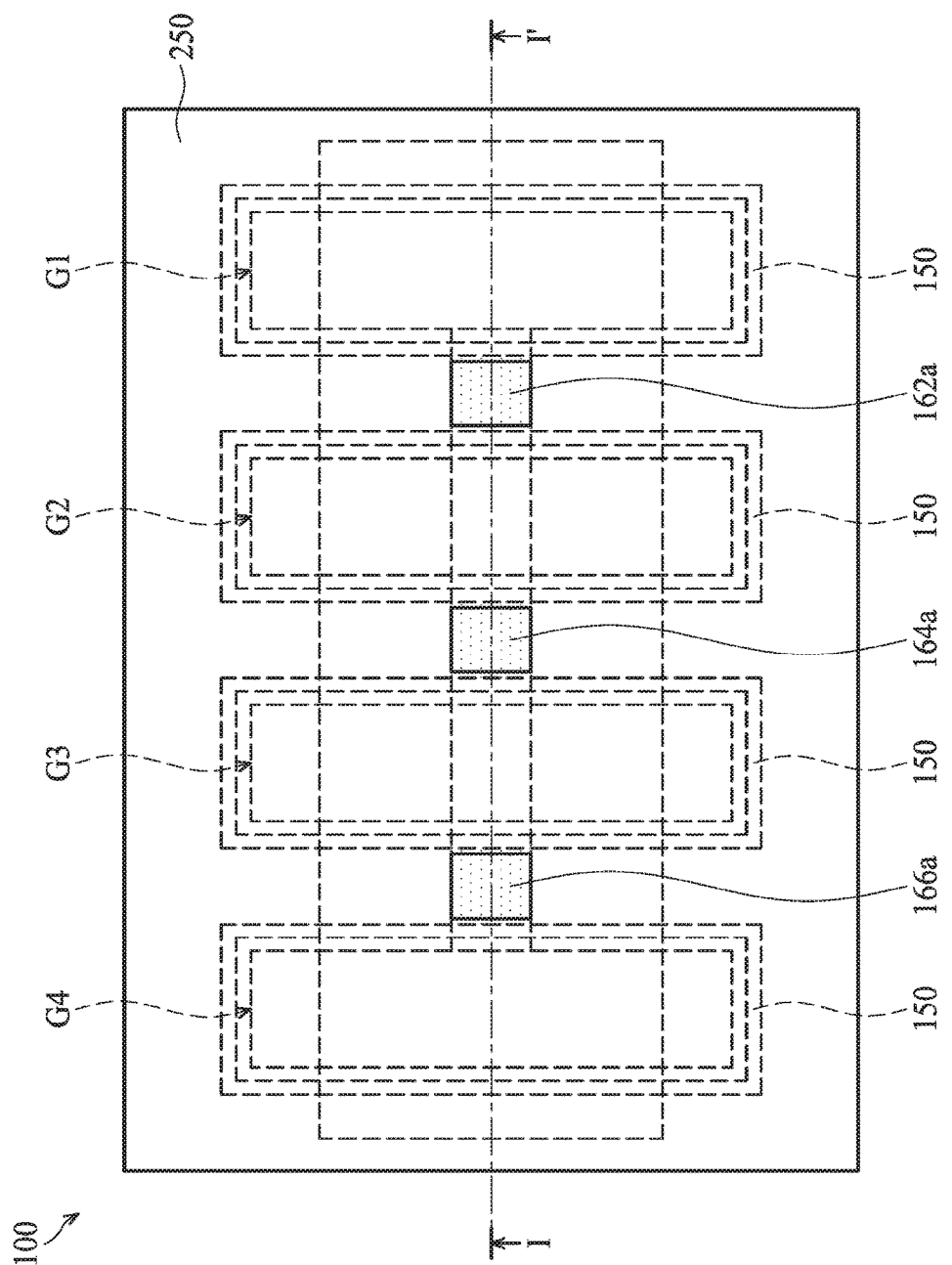
Figures 1, 1J:
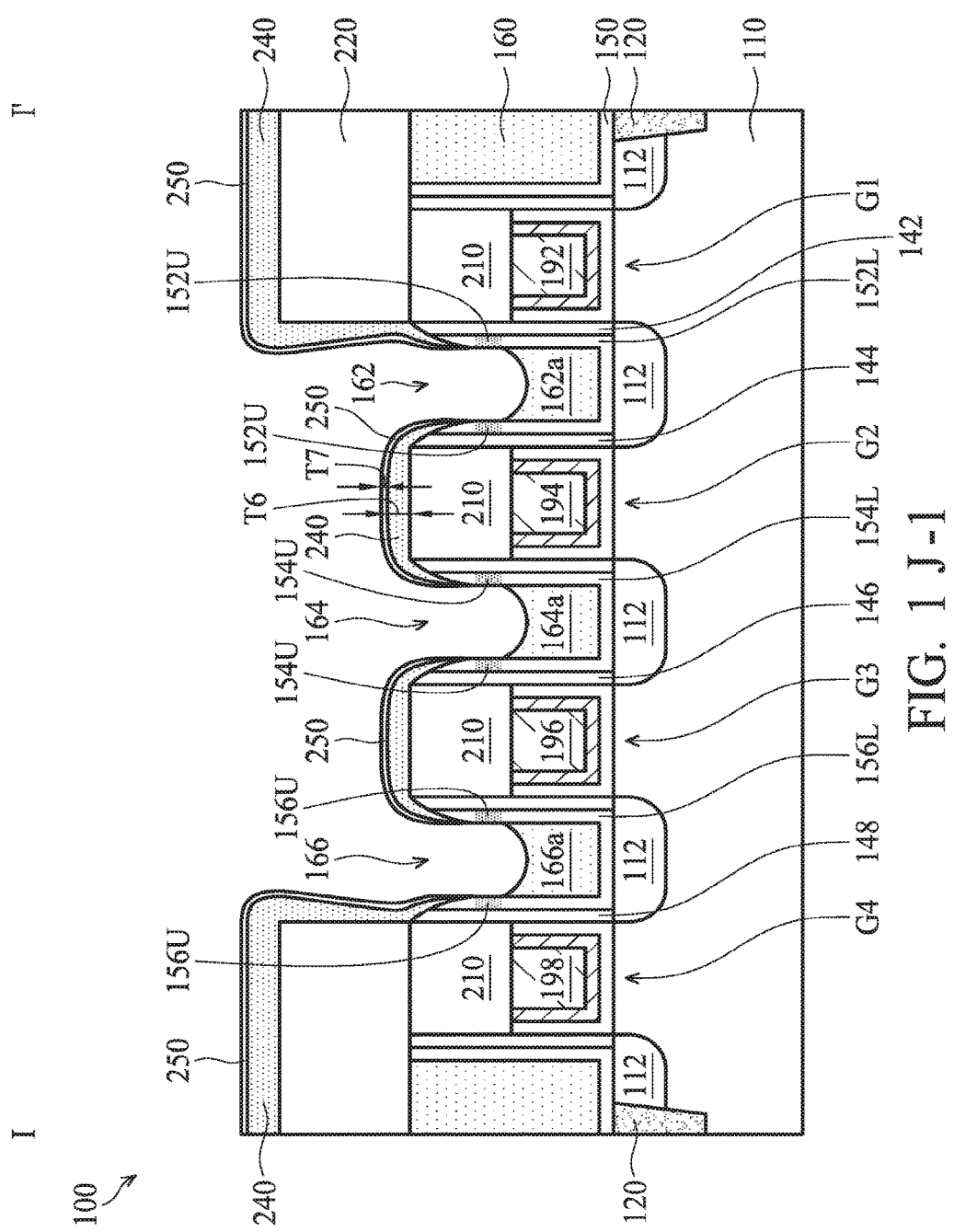
Figure 1K:
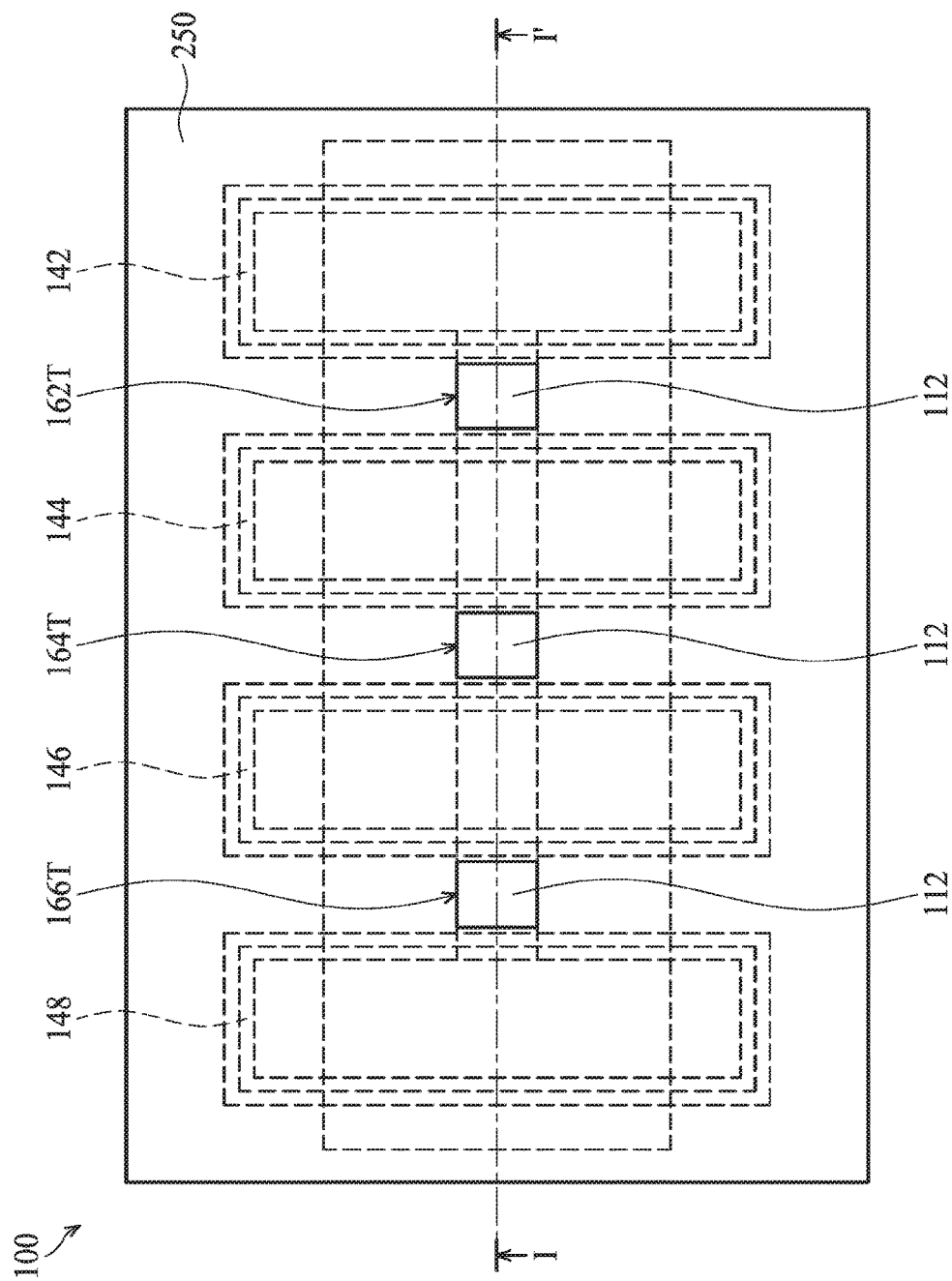
Figures 1, 1K:
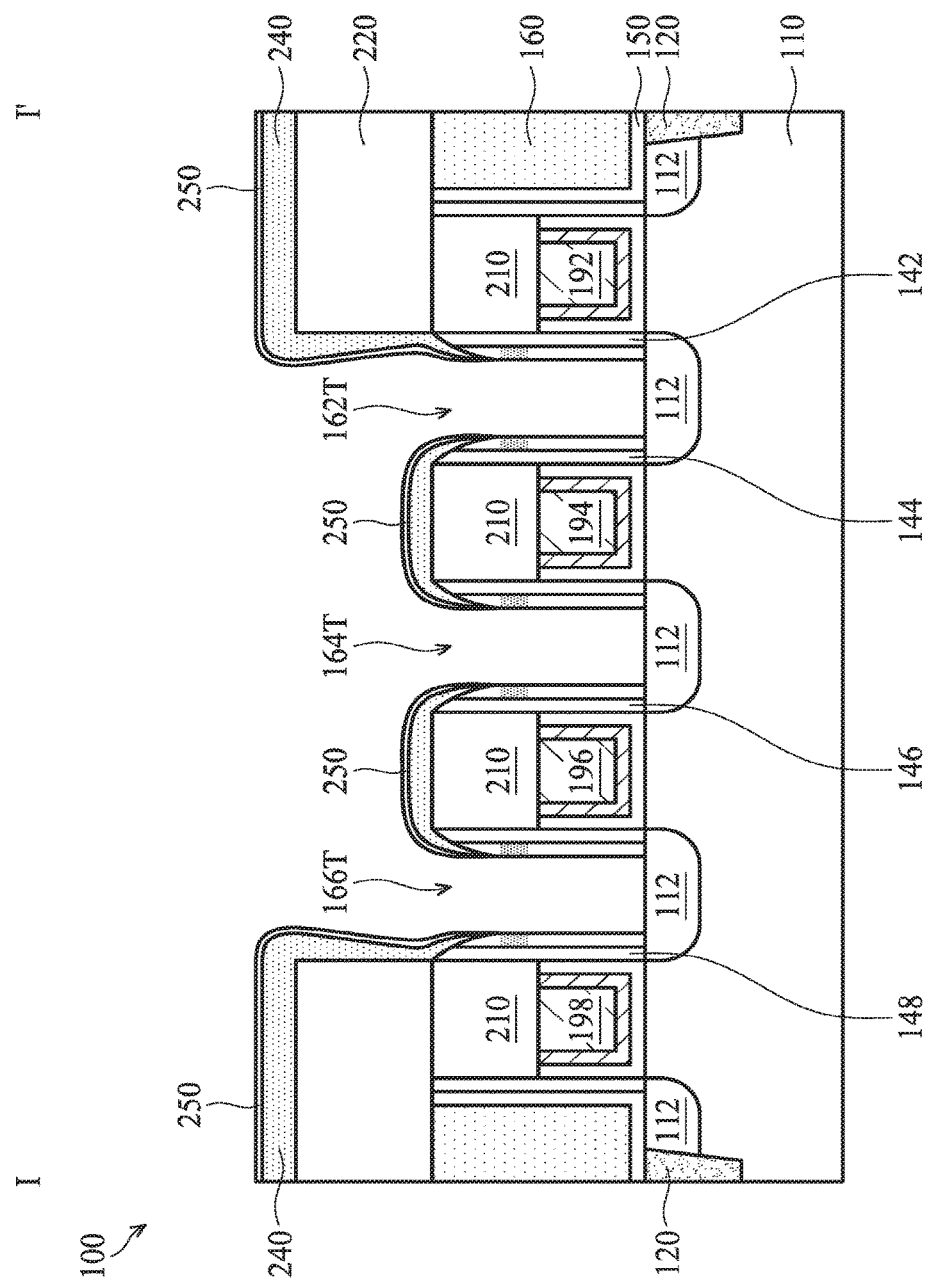
Figure 1L:
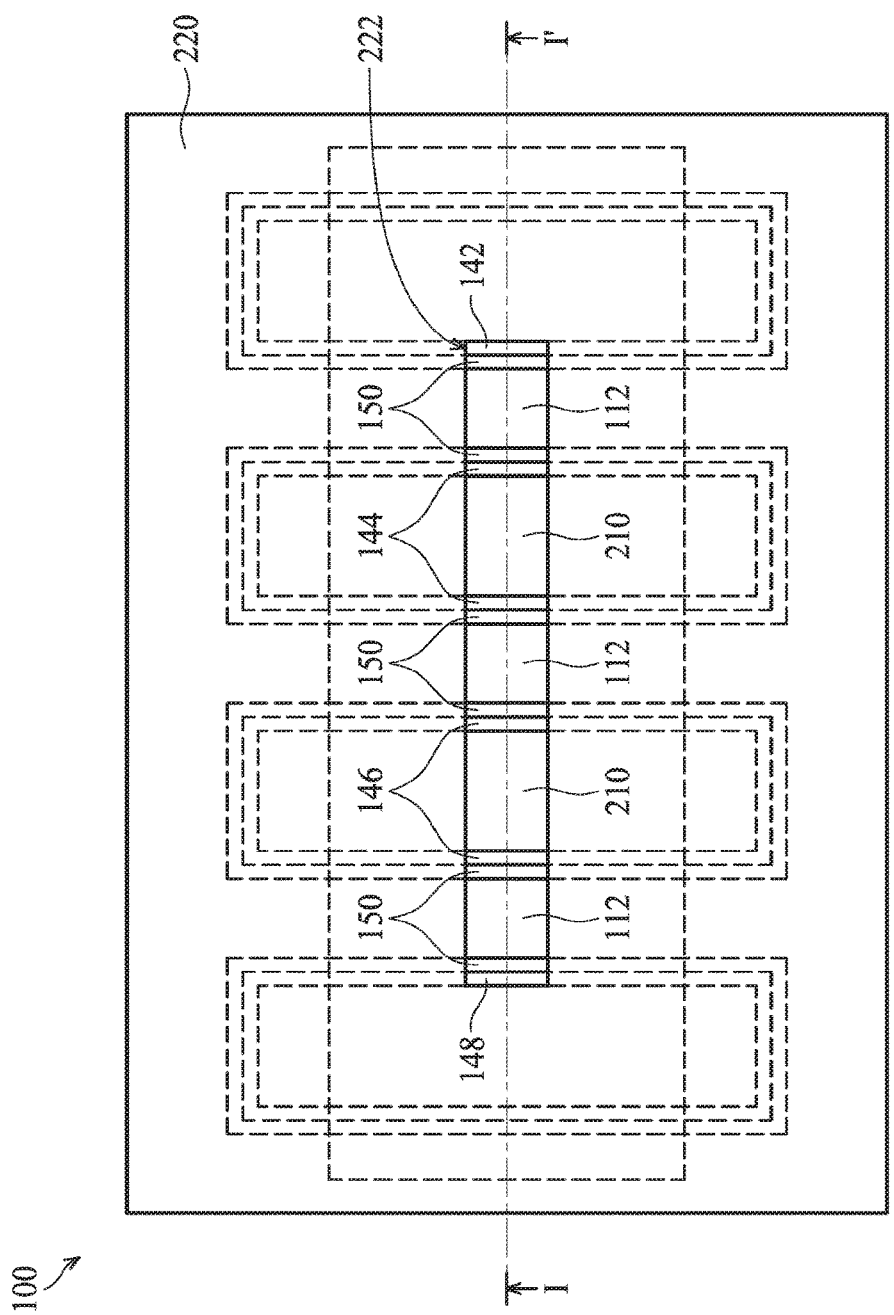
Figures 1, 1L:
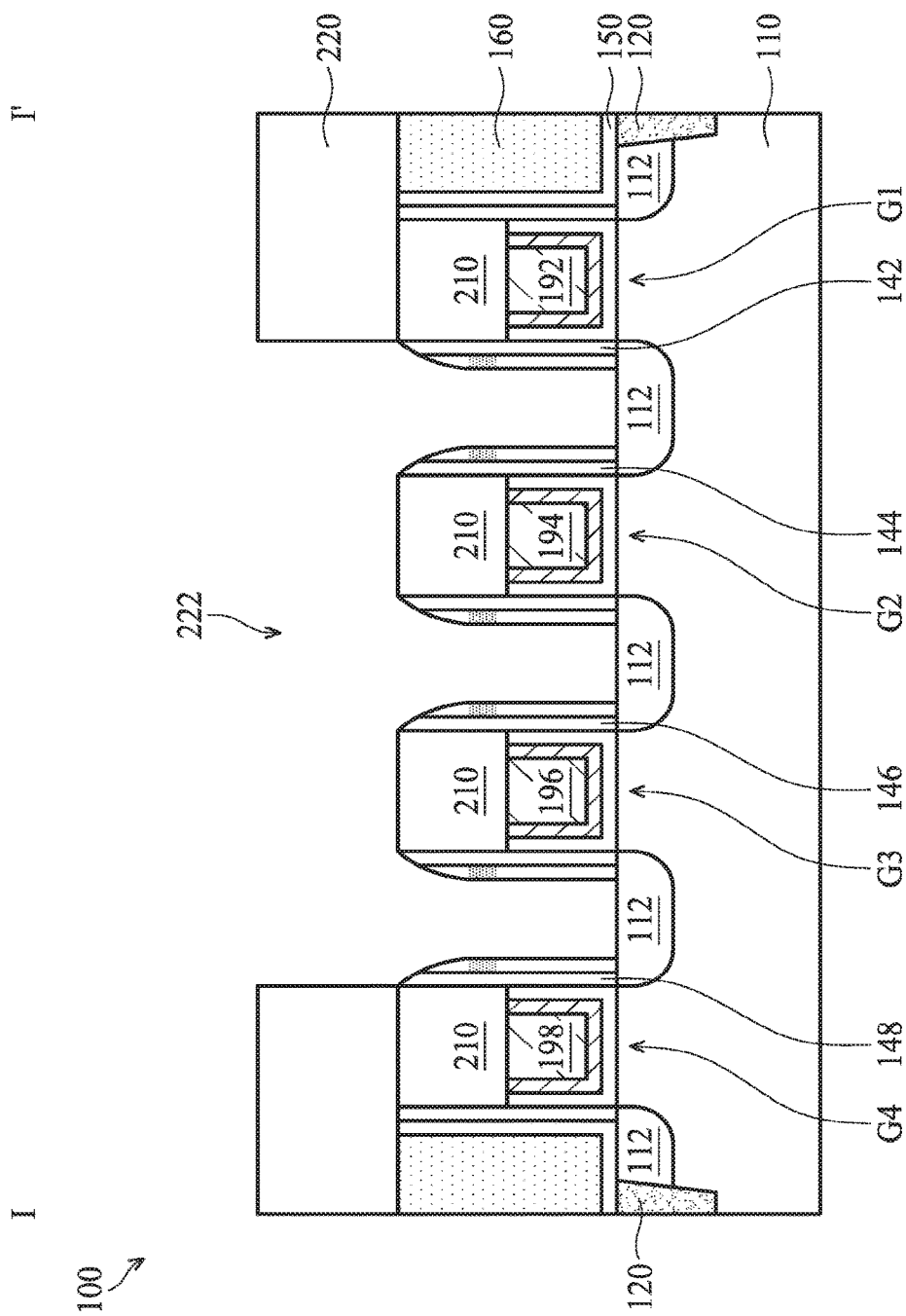
Figure 1M:
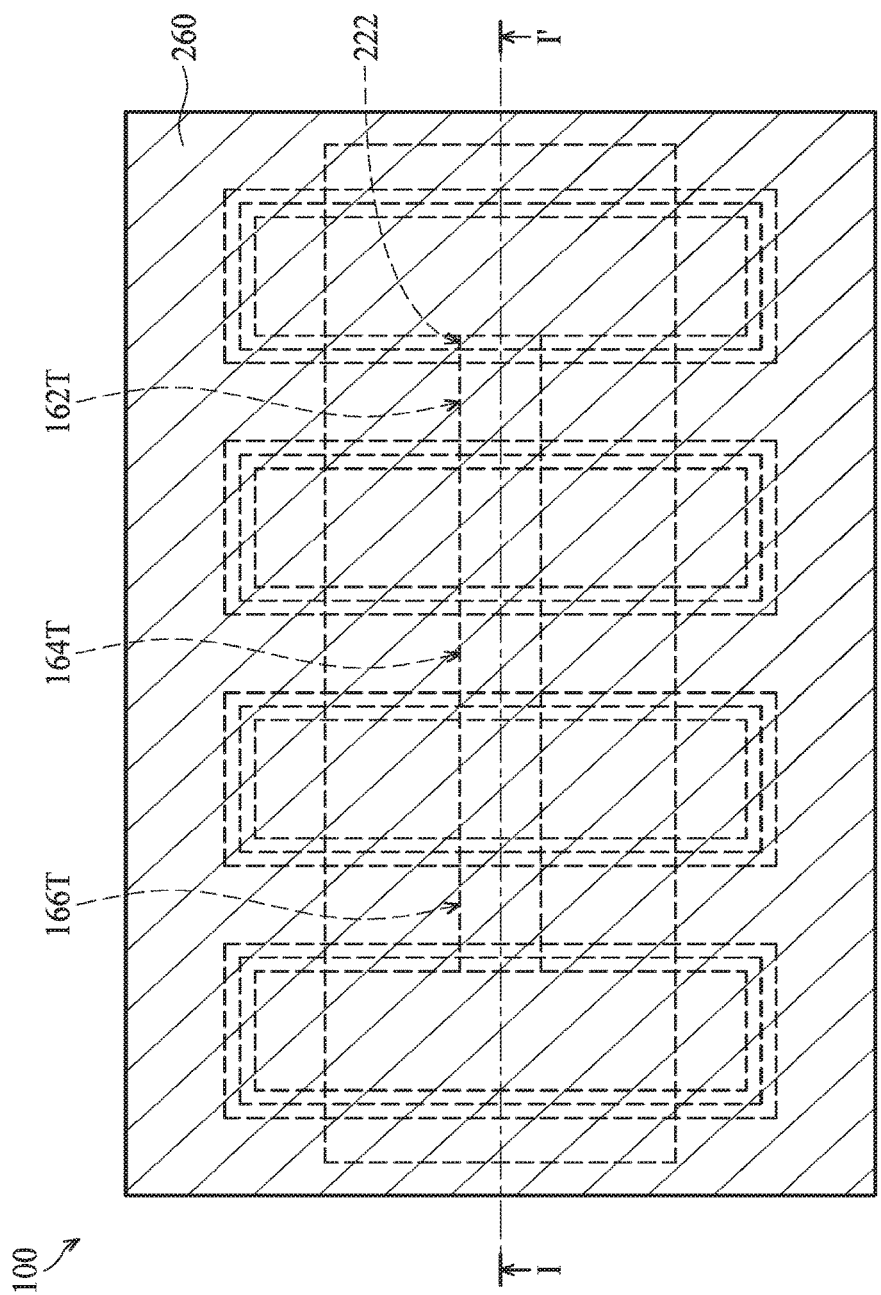
Figures 1, 1M:
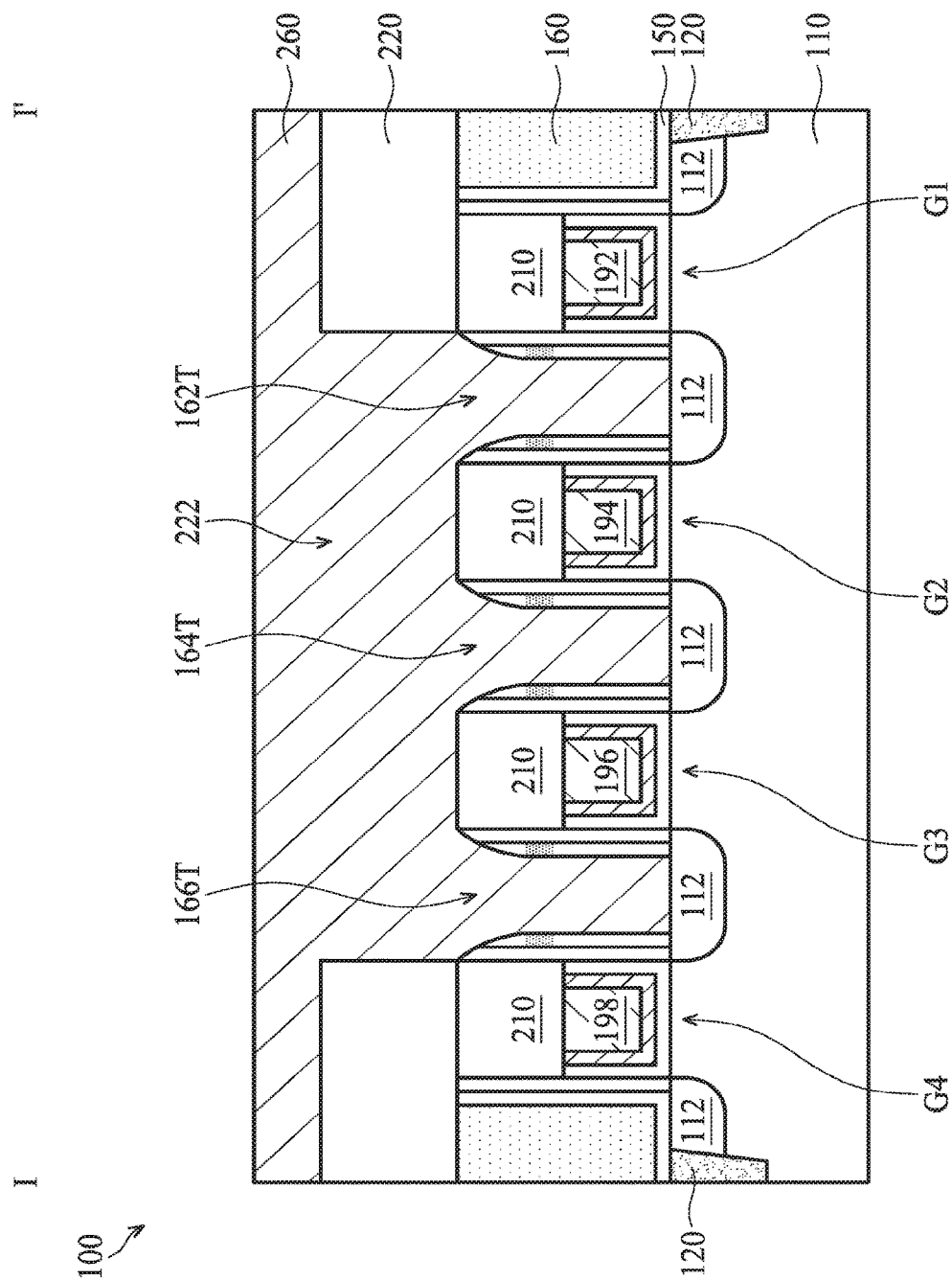
Figure 1N:
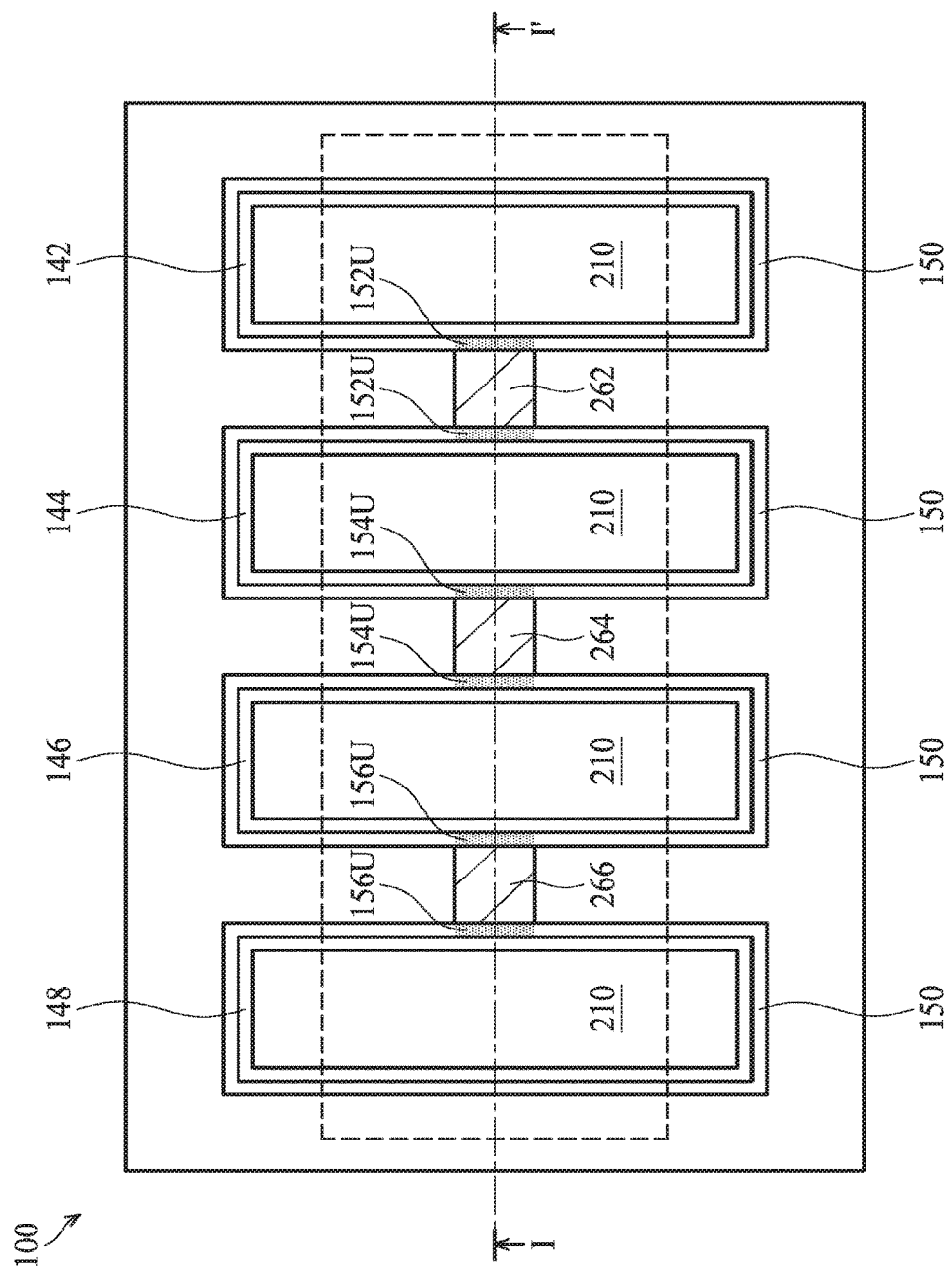
Figures 1, 1N:
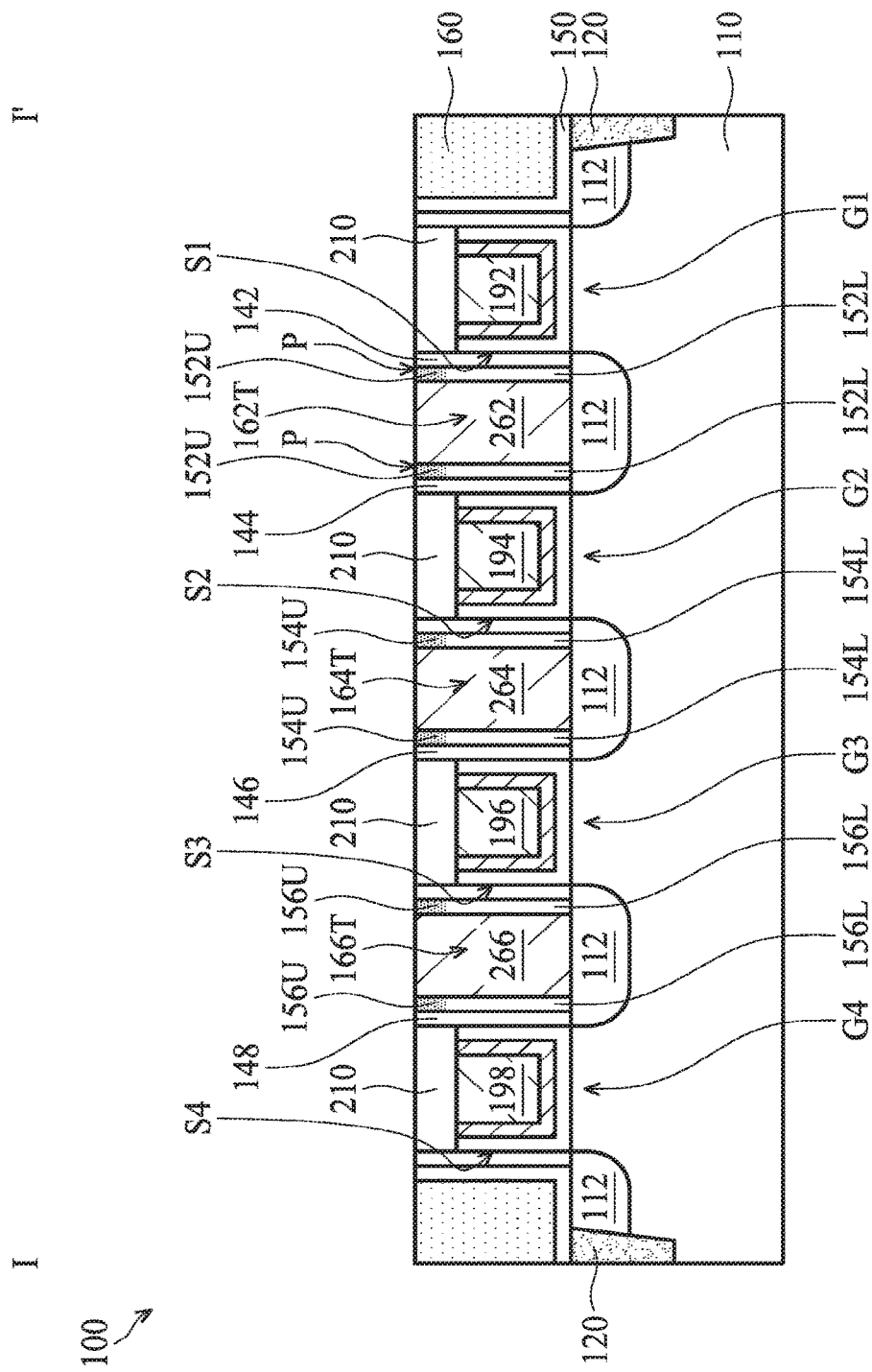

FIGS. 1A-1N are top views of various stages of a process for forming a semiconductor device structure 100, in accordance with some embodiments. FIGS. 1A-1 to 1N-1 are cross-sectional views illustrating the semiconductor device structure 100 along a sectional line I-I' in FIGS. 1A-1N respectively, in accordance with some embodiments.

As shown in FIGS. 1A and 1A-1, a semiconductor substrate 110 is provided. The semiconductor substrate 110 may be a semiconductor wafer (such as a silicon wafer) or a portion of a semiconductor wafer. In some embodiments, the semiconductor substrate 110 is made of an elementary semiconductor material including silicon or germanium in a single crystal, polycrystal, or amorphous structure.

In some other embodiments, the semiconductor substrate 110 is made of a compound semiconductor, such as silicon carbide, gallium arsenide, gallium phosphide, indium phosphide, indium arsenide, an alloy semiconductor, such as SiGe, or GaAsP, or a combination thereof. The semiconductor substrate 110 may also include multi-layer semiconductors, semiconductor on insulator (SOI) (such as silicon on insulator or germanium on insulator), or a combination thereof.

As shown in FIGS. 1A and 1A-1, an isolation structure 120 is formed in the semiconductor substrate 110 to define various active regions in the semiconductor substrate 110, and to electrically isolate neighboring devices (e.g. transistors) from one another, in accordance with some embodiments. The isolation structure 120 includes a dielectric material, such as silicon oxide, silicon nitride, silicon oxynitride, fluoride-doped silicate glass (FSG), a low-K dielectric material, another suitable material, or a combination thereof, in accordance with some embodiments. The isolation structure 120 is formed by using an isolation technology, such as local oxidation of semiconductor (LOCOS), shallow trench isolation (STI), or the like, in accordance with some embodiments.

In some embodiments, the formation of the isolation structure 120 includes patterning the semiconductor substrate 110 by performing a photolithography process, etching a trench in the semiconductor substrate 110, and filling the trench with the dielectric material. In some embodiments, the filled trench has a multi-layer structure, such as a thermal oxide liner layer filled with silicon nitride or silicon oxide.

As shown in FIGS. 1A and 1A-1, gate stacks 130 are formed over the semiconductor substrate 110, in accordance with some embodiments. Each of the gate stacks 130 includes a gate dielectric layer 132 and a gate electrode 134, in accordance with some embodiments. The gate electrode 134 is over the gate dielectric layer 132, in accordance with some embodiments. The gate dielectric layer 132 includes silicon oxide or another suitable dielectric material. The gate electrode 134 includes polysilicon or another suitable conductive material.

As shown in FIGS. 1A and 1A-1, each of the gate stacks 130 further includes a cap layer 136 over the gate electrode 134, in accordance with some embodiments. The cap layer 136 includes silicon nitride or another suitable dielectric material. As shown in FIGS. 1A and 1A-1, spacer layers 142, 144, 146, and 148 are formed over sidewalls of the gate stacks 130, respectively, in accordance with some embodiments.

The spacer layers 142, 144, 146, and 148 surround the gate stacks 130, respectively, in accordance with some embodiments. The spacer layers 142, 144, 146, and 148 include a dielectric material, such as silicon nitride, silicon oxynitride, or a combination thereof, in accordance with some embodiments.

As shown in FIGS. 1A and 1A-1, doped regions 112 are formed in the semiconductor substrate 110, in accordance with some embodiments. The doped regions 112 are on opposite sides of each of the gate stacks 130, in accordance with some embodiments. The doped regions 112 are formed using an ion implantation process, in accordance with some embodiments. The doped regions 112 include heavily doped source regions and heavily doped drain regions, in accordance with some embodiments. The doped regions 112 are formed after the formation of the spacer layers 142, 144, 146, and 148, in accordance with some embodiments.

As shown in FIGS. 1A and 1A-1, a contact etch stop layer 150 is formed over the semiconductor substrate 110, the gate stacks 130, and the spacer layers 142, 144, 146, and 148, in accordance with some embodiments. The contact etch stop layer 150 includes a dielectric material, such as silicon nitride, in accordance with some embodiments. In some other embodiments, the contact etch stop layer 150 is not formed.

As shown in FIGS. 1A and 1A-1, a dielectric layer 160 is deposited over the contact etch stop layer 150, in accordance with some embodiments. The dielectric layer 160 includes an insulating material, in accordance with some embodiments. The insulating material includes silicon oxide, borosilicate glass (BSG), phosphoric silicate glass (PSG), borophosphosilicate glass (BPSG), fluorinated silicate glass (FSG), low-k material, porous dielectric material, or a combination thereof, in accordance with some embodiments. The dielectric layer 160 is formed using a CVD process, a HDPCVD process, a spin-on process, a sputtering process, or a combination thereof, in accordance with some embodiments.

As shown in FIGS. 1B and 1B-1, a planarization process is then performed on the dielectric layer 160 and the contact etch stop layer 150 until top surfaces of the gate stacks 130 are exposed, in accordance with some embodiments. The planarization process includes a chemical mechanical polishing (CMP) process, in accordance with some embodiments. After the planarization process is performed, the dielectric layer 160 has a substantially planar surface to facilitate subsequent process steps, in accordance with some embodiments.

As shown in FIGS. 1C and 1C-1, the gate stacks 130 are removed, in accordance with some embodiments. The removal process includes a wet etching process, a dry etching process, or a combination thereof, in accordance with some embodiments. After the gate stacks 130 are removed, openings 142a, 144a, 146a, and 148a are formed in the spacer layers 142, 144, 146, and 148, in accordance with some embodiments. The openings 142a, 144a, 146a, and 148a are trenches, in accordance with some embodiments.

As shown in FIGS. 1C and 1C-1, a gate dielectric layer 170 is deposited over the dielectric layer 160, the contact etch stop layer 150, the spacer layers 142, 144, 146, and 148, and inner walls and bottom surfaces of the openings 142a, 144a, 146a, and 148a, in accordance with some embodiments. The gate dielectric layer 170 includes silicon oxide or another suitable dielectric material.

In some embodiments, the gate dielectric layer 170 includes a high dielectric constant material (high-k material), in accordance with some embodiments. The high-k material includes hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), or a combination thereof, in accordance with some embodiments.

The high-k material includes metal oxides, metal nitrides, metal silicates, transition metal-oxides, transition metal-nitrides, transition metal-silicates, oxynitrides of metals, aluminum oxide, hafnium dioxide-alumina ($HfO_2$—$Al_2O_3$) alloy, another suitable material, or a combination thereof, in accordance with some embodiments.

As shown in FIGS. 1C and 1C-1, a work function metal layer 180 is deposited over the gate dielectric layer 170, in accordance with some embodiments. The work function metal layer 180 provides a desired work function for transistors to enhance device performance including improved threshold voltage, in accordance with some embodiments.

In the embodiments of forming an NMOS transistor, the work function metal layer 180 can be an n-type metal capable of providing a work function value suitable for the device, such as equal to or less than about 4.5 eV. The n-type metal includes metal, metal carbide, metal nitride, or a combination thereof, in accordance with some embodiments. For example, the n-type metal is made of tantalum, tantalum nitride, or a combination thereof.

On the other hand, in the embodiments of forming a PMOS transistor, the work function metal layer 180 can be a p-type metal capable of providing a work function value suitable for the device, such as equal to or greater than about 4.8 eV. The p-type metal includes metal, metal carbide, metal nitride, another suitable material, or a combination thereof, in accordance with some embodiments. For example, the p-type metal is made of titanium, titanium nitride, another suitable material, or a combination thereof.

The work function metal layer 180 includes hafnium, zirconium, titanium, tantalum, aluminum, metal carbides, aluminides, ruthenium or a combination thereof, in accordance with some embodiments. The metal carbides include hafnium carbide or zirconium carbide, in accordance with some embodiments. The work function metal layer 180 is deposited using a PVD process, CVD process, ALD process, plating process, another suitable method, or a combination thereof, in accordance with some embodiments.

As shown in FIGS. 1C and 1C-1, a gate electrode layer 190 is deposited over the work function metal layer 180 to fill the openings 142a, 144a, 146a, and 148a, in accordance with some embodiments. The gate electrode layer 190 is also referred to as a metal gate electrode layer, in accordance with some embodiments. The gate electrode layer 190 includes a suitable metal material, such as aluminum, tungsten, gold, platinum, cobalt, another suitable metal, an alloy thereof, or a combination thereof, in accordance with some embodiments. The gate electrode layer 190 is deposited using a PVD process, a CVD process, a plating process, the like, or a combination thereof, in accordance with some embodiments.

As shown in FIGS. 1D and 1D-1, a planarization process is performed to remove the gate electrode layer 190, the work function metal layer 180, and the gate dielectric layer 170 outside of the openings 142a, 144a, 146a, and 148a, in accordance with some embodiments. The gate electrode layer 190 remaining in the openings 142a, 144a, 146a, and 148a forms gate electrodes 192, 194, 196, and 198, respectively, in accordance with some embodiments. The planarization process includes a chemical mechanical polishing (CMP) process or the like, in accordance with some embodiments.

As shown in FIGS. 1E and 1E-1, top portions of the work function metal layer 180, the gate dielectric layer 170, and the gate electrodes 192, 194, 196, and 198 are removed, in accordance with some embodiments. The removal process includes an etching process, in accordance with some embodiments. After the removal process, recesses R1, R2, R3, and R4 are formed in the spacer layers 142, 144, 146, and 148, respectively, in accordance with some embodiments.

As shown in FIGS. 1E and 1E-1, a cap layer 210 is formed over the dielectric layer 160 to fill the recesses R1, R2, R3, and R4, in accordance with some embodiments. The cap layer 210 is configured to prevent the gate electrodes 192, 194, 196, and 198 from shorting conductive contact structures formed subsequently, in accordance with some embodiments. The cap layer 210 includes a dielectric material, such as silicon nitride, in accordance with some embodiments. The cap layer 210 is formed using a chemical vapor deposition process or another suitable process.

As shown in FIGS. 1F and 1F-1, the cap layer 210 outside of the recesses R1, R2, R3, and R4 is removed, in accordance with some embodiments. The removal process includes a chemical mechanical polishing process, in accordance with some embodiments. In some embodiments, a gate stack G1 is formed in the opening 142a. The gate stack G1 includes the gate electrode 192, the work function metal layer 180, and the gate dielectric layer 170 in the opening 142a, in accordance with some embodiments. The gate stack G1 further includes the cap layer 210 in the opening 142a, in accordance with some embodiments.

In some embodiments, a gate stack G2 is formed in the opening 144a. The gate stack G2 includes the gate electrode 194, the work function metal layer 180, and the gate dielectric layer 170 in the opening 144a, in accordance with some embodiments. The gate stack G2 further includes the cap layer 210 in the opening 144a, in accordance with some embodiments.

In some embodiments, a gate stack G3 is formed in the opening 146a. The gate stack G3 includes the gate electrode 196, the work function metal layer 180, and the gate dielectric layer 170 in the opening 146a, in accordance with some embodiments. The gate stack G3 further includes the cap layer 210 in the opening 146a, in accordance with some embodiments.

In some embodiments, a gate stack G4 is formed in the opening 148a. The gate stack G4 includes the gate electrode 198, the work function metal layer 180, and the gate dielectric layer 170 in the opening 148a, in accordance with some embodiments. The gate stack G4 further includes the cap layer 210 in the opening 148a, in accordance with some embodiments. The gate stacks G1, G2, G3, and G4 are surrounded by the dielectric layer 160, in accordance with some embodiments.

As shown in FIGS. 1F and 1F-1, a mask layer 220 is formed over the dielectric layer 160, the contact etch stop layer 150, the spacer layers 142, 144, 146, and 148, and the cap layer 210, in accordance with some embodiments. The mask layer 220 includes an insulating material, in accordance with some embodiments. The insulating material includes silicon oxide, borosilicate glass (BSG), phosphoric silicate glass (PSG), borophosphosilicate glass (BPSG), fluorinated silicate glass (FSG), low-k material, porous dielectric material, or a combination thereof, in accordance with some embodiments. The mask layer 220 is formed using a CVD process, a HDPCVD process, a spin-on process, a sputtering process, or a combination thereof, in accordance with some embodiments.

As shown in FIGS. 1F and 1F-1, a mask layer 230 is formed over the mask layer 220, in accordance with some embodiments. The mask layer 230 has an opening 232 exposing a portion of the mask layer 220, in accordance with some embodiments. The mask layer 230 includes a nitride material (e.g., titanium nitride), in accordance with some embodiments. The mask layer 230 is formed using a deposition process, a photolithography process, and an etching process, in accordance with some embodiments. In some other embodiments, the mask layer 230 includes a photoresist material. The mask layer 230 is formed using a coating process and a photolithography process, in accordance with some embodiments.

As shown in FIGS. 1F, 1F-1, 1G, and 1G-1, portions of the mask layer 220 and the dielectric layer 160 are removed through the opening 232 of the mask layer 230, in accordance with some embodiments. After the removal process, an opening 222 is formed in the mask layer 220, and holes 162, 164, and 166 are formed in the dielectric layer 160, in accordance with some embodiments. The opening 222 exposes portions of the cap layer 210, the spacer layers 142, 144, 146, and 148, and the contact etch stop layer 150, in accordance with some embodiments.

The hole 162 is formed between the gate stacks G1 and G2, in accordance with some embodiments. The hole 164 is formed between the gate stacks G2 and G3, in accordance with some embodiments. The hole 166 is formed between the gate stacks G3 and G4, in accordance with some embodiments. The hole 162 is adjacent to the spacer layers 142 and 144, in accordance with some embodiments. The hole 164 is adjacent to the spacer layers 144 and 146, in accordance with some embodiments. The hole 166 is adjacent to the spacer layers 146 and 148, in accordance with some embodiments.

The holes 162, 164, and 166 do not penetrate through the dielectric layer 160, in accordance with some embodiments. That is, portions 162a, 164a, and 166a of the dielectric layer 160 are under the holes 162, 164, and 166, in accordance with some embodiments. The portion 162a, 164a, or 166a has a thickness T1 (or a minimum thickness T1), in accordance with some embodiments.

The gate stack G1, G2, G3, or G4 have a thickness T2, in accordance with some embodiments. In some embodiments, a ratio of the thickness T1 to the thickness T2 ranges from about 0.4 to about 0.6. The hole 162, 164, or 166 has a depth D (or a maximum depth D), in accordance with some embodiments. In some embodiments, a ratio of the depth D to the thickness T2 ranges from about 0.4 to about 0.6.

The removal process further removes top portions of the spacer layers 142, 144, 146, and 148 and the contact etch stop layer 150, in accordance with some embodiments. The removal process includes performing an etching process using the mask layer 230 as an etching mask, in accordance with some embodiments. The etching process includes an anisotropic etching process, such as a dry etching process, in accordance with some embodiments. As shown in FIGS. 1G and 1G-1, the mask layer 230 is removed, in accordance with some embodiments.

As shown in FIGS. 1H and 1H-1, a protection material layer 240a is formed over the mask layer 220, the dielectric layer 160, the contact etch stop layer 150, the spacer layers 142, 144, 146, and 148, the cap layer 210, in accordance with some embodiments. The protection material layer 240a includes a metal compound material or a metal material, in accordance with some embodiments. The metal compound material includes titanium nitride, tantalum nitride, or another suitable metal compound material. The metal material includes tungsten, tantalum, cobalt, nickel, or another suitable metal material. In some embodiments, the metal compound material and the metal material are able to react with silicon.

The protection material layer 240a is formed using an anisotropic deposition process, in accordance with some embodiments. During the anisotropic deposition process, the deposition rate is negatively correlated to (or inversely proportional to) the aspect ratio of the position to be deposited. Since the aspect ratio of the opening 222 is less than the aspect ratio of the hole 162, 164, or 166, the deposition rate over the cap layer 210 is greater than the deposition rate over the portions 162a, 164a, and 166a of the dielectric layer 160, in accordance with some embodiments.

The protection material layer 240a over the cap layer 210 has a thickness T3, in accordance with some embodiments. The protection material layer 240a over the portions 162a, 164a, and 166a has a thickness T4, in accordance with some embodiments. The thickness T3 is greater than the thickness T4, in accordance with some embodiments.

The thickness of the protection material layer 240a decreases from the cap layer 210 to the portions 162a, 164a, and 166a, in accordance with some embodiments. The thickness of the protection material layer 240a gradually (or continuously) decreases from the cap layer 210 to the portions 162a, 164a, and 166a, in accordance with some embodiments. The protection material layer 240a over the mask layer 220 has a thickness T5, in accordance with some embodiments. The thickness T5 is greater than the thickness T3, in accordance with some embodiments.

As shown in FIGS. 1I and 1I-1, the protection material layer 240a is thinned, in accordance with some embodiments. After the thinning process, the remaining protection material layer 240a forms a protection layer 240, in accordance with some embodiments. The protection layer 240 has openings 242, 244, and 246, in accordance with some embodiments.

The opening 242 exposes the portion 162a and the contact etch stop layer 150 adjacent to the hole 162, in accordance with some embodiments. The opening 244 exposes the portion 164a and the contact etch stop layer 150 adjacent to the hole 164, in accordance with some embodiments. The opening 246 exposes the portion 166a and the contact etch stop layer 150 adjacent to the hole 166, in accordance with some embodiments.

The protection layer 240 covers the cap layer 210, the contact etch stop layer 150, and the spacer layers 142, 144, 146, and 148, in accordance with some embodiments. Therefore, the protection layer 240 is able to prevent the cap layer 210, the contact etch stop layer 150, the spacer layers 142, 144, 146, and 148 from the damage caused by the subsequent removal process, in accordance with some embodiments.

The protection layer 240 conformally covers surfaces 212, 151, 142b, 144b, 146b, and 148b of the cap layer 210, the contact etch stop layer 150, and the spacer layers 142, 144, 146, and 148, in accordance with some embodiments. The thinning process includes an isotropic etching process, in accordance with some embodiments. The isotropic etching process includes a wet etching process, in accordance with some embodiments.

As shown in FIGS. 1G-1, 1H-1, and 1I-1, the ratio of the depth D to the thickness T2 ranges from about 0.4 to about 0.6. If the ratio of the depth D to the thickness T2 is less than 0.4, the thickness difference between the protection material layer 240a over the cap layer 210 and the protection material layer 240a over the portion 162a, 164a, or 166a may be too small to form the protection layer 240 with an enough thickness. If the ratio of the depth D to the thickness T2 is greater than 0.6, the cap layer 210, the spacer layers 142, 144, 146, and 148, and the contact etch stop layer 150 may be damaged by the removal process of FIG. 1G-1.

As shown in FIGS. 1J and 1J-1, a protection layer 250 is formed on the protection layer 240, in accordance with some embodiments. The protection layer 250 conformally covers the protection layer 240, in accordance with some embodiments. In some embodiments, the etching resistance of the protection layer 250 is greater than that of the protection layer 240. In some embodiments, the etching resistance of the protection layers 240 and 250 is greater than that of the protection layer 240.

The protection layer 250 is thinner than the protection layer 240, in accordance with some embodiments. The thickness T7 of the protection layer 250 is less than the thickness T6 of the protection layer 240 over the cap layer 210, in accordance with some embodiments. The thickness T6 is a maximum thickness of the protection layer 240 over the cap layer 210, in accordance with some embodiments. The average thickness of the protection layer 250 is less than the average thickness of the protection layer 240, in accordance with some embodiments. The thickness T6 ranges from about 20 nm to about 5 nm, in accordance with some embodiments.

The protection layers 240 and 250 are made of different materials, in accordance with some embodiments. The protection layer 250 includes a metal compound material (e.g., a metal silicide material), in accordance with some embodiments. The protection layers 240 and 250 have a same metal element, in accordance with some embodiments. For example, the protection layer 240 includes titanium nitride (or titanium), tantalum nitride (or tantalum), tungsten, cobalt, or nickel, and the protection layer 250 includes titanium silicide (or titanium silicon nitride), tantalum silicide, tungsten silicide, cobalt silicide, nickel silicide.

The formation of the protection layer 250 includes siliciding an upper portion (or a surface portion) of the protection layer 240, in accordance with some embodiments. The siliciding process includes reacting the protection layer 240 with a silicon-containing gas, in accordance with some embodiments. The silicon-containing gas includes $SiH_4$, $SiH_2Cl_2$, $SiH_2Br_2$, $Si_2H_6$, the like, or the combination thereof, in accordance with some embodiments.

The siliciding process is performed at a temperature ranging from about 350° C. to about 400° C., in accordance with some embodiments. The siliciding process is performed at a pressure ranging from about 60 Torr to about 200 Torr, in accordance with some embodiments. The siliciding process is performed using a gas mixture containing 20-40 vol % of the silicon-containing gas and 80-60 vol % of a carrier gas, in accordance with some embodiments. The carrier gas includes $N_2$, $H_2$, Ar, and/or another suitable gas.

The contact etch stop layer 150 has upper portions 152U, 154U, and 156U exposed by the holes 162, 164, and 166, respectively, in accordance with some embodiments. The contact etch stop layer 150 has lower portions 152L, 154L, and 156L covered by the portions 162a, 164a, and 166a, respectively, in accordance with some embodiments.

After the siliciding process, a first silicon concentration of the upper portion 152U, 154U, or 156U is greater than a second silicon concentration of the lower portion 152L, 154L, or 156L, in accordance with some embodiments. The first silicon concentration of the upper portion 152U, 154U, or 156U is greater than a third silicon concentration of the spacer layer 142, 144, 146, or 148, in accordance with some embodiments.

In some embodiments, the contact etch stop layer 150 includes silicon nitride. The first atomic ratio of the silicon elements to the nitrogen element in the upper portion 152U, 154U, or 156U is greater than the second atomic ratio of the silicon elements to the nitrogen element in the lower portion 152L, 154L, or 156L, in accordance with some embodiments. The first atomic ratio ranges from about 1.2 to about 1.5, in accordance with some embodiments. The second atomic ratio ranges from about 0.75 to about 1, in accordance with some embodiments.

As shown in FIGS. 1K and 1K-1, the portions 162a, 164a, and 166a of the dielectric layer 160 and the contact etch stop layer 150 under the portions 162a, 164a, and 166a are removed, in accordance with some embodiments. After the removal process, through holes 162T, 164T, and 166T are formed in the dielectric layer 160 and the contact etch stop layer 150, in accordance with some embodiments.

The through holes 162T, 164T, and 166T expose the doped regions 112 thereunder, respectively, in accordance with some embodiments. The removal process includes a dry etching process, in accordance with some embodiments. The removal process is also referred to as a contact hole etching process, in accordance with some embodiments. The through holes 162T, 164T, and 166T are also referred to as contact holes, in accordance with some embodiments.

The protection layers 240 and 250 cover the cap layer 210, the contact etch stop layer 150, and the spacer layers 142, 144, 146, and 148, in accordance with some embodiments. Therefore, the protection layers 240 and 250 prevent the cap layer 210, the contact etch stop layer 150, the spacer layers 142, 144, 146, and 148 from the damage caused by the removal process, in accordance with some embodiments.

As a result, the protection layers 240 and 250 prevent the gate electrodes 192, 194, 196, and 198 from shorting conductive contact structures, which are formed in the through holes 162T, 164T, and 166T subsequently, in accordance with some embodiments. Therefore, the yield of the semiconductor device structure 100 is improved, in accordance with some embodiments.

As shown in FIGS. 1L and 1L-1, the protection layers 240 and 250 are removed, in accordance with some embodiments. The removal process includes a wet etching process, in accordance with some embodiments. The wet etching process includes dipping the protection layers 240 and 250 into an etching solution, in accordance with some embodiments. The etching solution includes $H_2SO_4$ and $H_2O_2$, in accordance with some embodiments.

The protection layers 240 and 250 include the metal element, in accordance with some embodiments. Therefore, the etching selectivity ratio of the protection layers 240 and 250 to the contact etch stop layer 150, the spacer layers 142, 144, 146, and 148, and the cap layer 210 is high. As a result, the wet etching process may remove the protection layers 240 and 250 without damaging the contact etch stop layer 150, the spacer layers 142, 144, 146, and 148, and the cap layer 210.

As shown in FIGS. 1M and 1M-1, a conductive layer 260 is formed over the mask layer 220 and the gate stacks G1, G2, G3, and G4 to fill into the opening 222 and the through holes 162T, 164T, and 166T, in accordance with some embodiments. The formation of the conductive layer 260 includes performing a physical vapor deposition process, a chemical vapor deposition process, or another suitable process.

As shown in FIGS. 1N and 1N-1, the mask layer 220 and top portions of the conductive layer 260, dielectric layer 160, the contact etch stop layer 150, the spacer layers 142, 144, 146, and 148, and the cap layer 210 are removed, in accordance with some embodiments. After the removal process, the conductive layer 260 remaining in the through holes 162T, 164T, and 166T forms conductive contact structures 262, 264, and 266, in accordance with some embodiments. The conductive contact structures 262, 264, and 266 pass through the dielectric layer 160 and the contact etch stop layer 150, in accordance with some embodiments.

The conductive contact structures 262, 264, and 266 are electrically connected to the doped regions 112 thereunder, respectively, in accordance with some embodiments. The conductive contact structures 262 and 264 are located on two opposite sides of the gate stack G2, in accordance with some embodiments. The conductive contact structures 264 and 266 are located on two opposite sides of the gate stack G3, in accordance with some embodiments.

The contact etch stop layer 150 covers sidewalls S1, S2, S3, and S4 of the gate stacks G1,G2,G3, and G4, in accordance with some embodiments. The upper portions 152U and the lower portions 152L of the contact etch stop layer 150 are adjacent to the conductive contact structure 262, in accordance with some embodiments. The conductive contact structure 262 is in direct contact with the upper portions 152U and the lower portions 152L, in accordance with some embodiments.

The upper portions 152U are between the cap layer 210 of the gate stack G1 and the cap layer 210 of the gate stack G2, in accordance with some embodiments. The upper portion 152U is between the cap layer 210 of the gate stack G2 and the conductive contact structure 262, in accordance with some embodiments. The upper portion 152U is adjacent to the top surface P of the contact etch stop layer 150, in accordance with some embodiments.

The upper portions 154U and the lower portions 154L of the contact etch stop layer 150 are adjacent to the conductive contact structure 264, in accordance with some embodiments. The conductive contact structure 264 is in direct contact with the upper portions 154U and the lower portions 154L, in accordance with some embodiments.

The upper portions 156U and the lower portions 156L of the contact etch stop layer 150 are adjacent to the conductive contact structure 266, in accordance with some embodiments. The conductive contact structure 266 is in direct contact with the upper portions 156U and the lower portions 156L, in accordance with some embodiments. The dielectric layer 160 surrounds the gate stacks G1,G2,G3, and G4, in accordance with some embodiments. The removal process includes a chemical polishing process, in accordance with some embodiments.

Since the protection layers 240 and 250 (as shown in FIG. 1J-1) prevent the gate electrodes 192, 194, 196, and 198 from shorting the conductive contact structures 262, 264, and 266, the yield of the semiconductor device structure 100 is improved, in accordance with some embodiments.

Figure 2A:
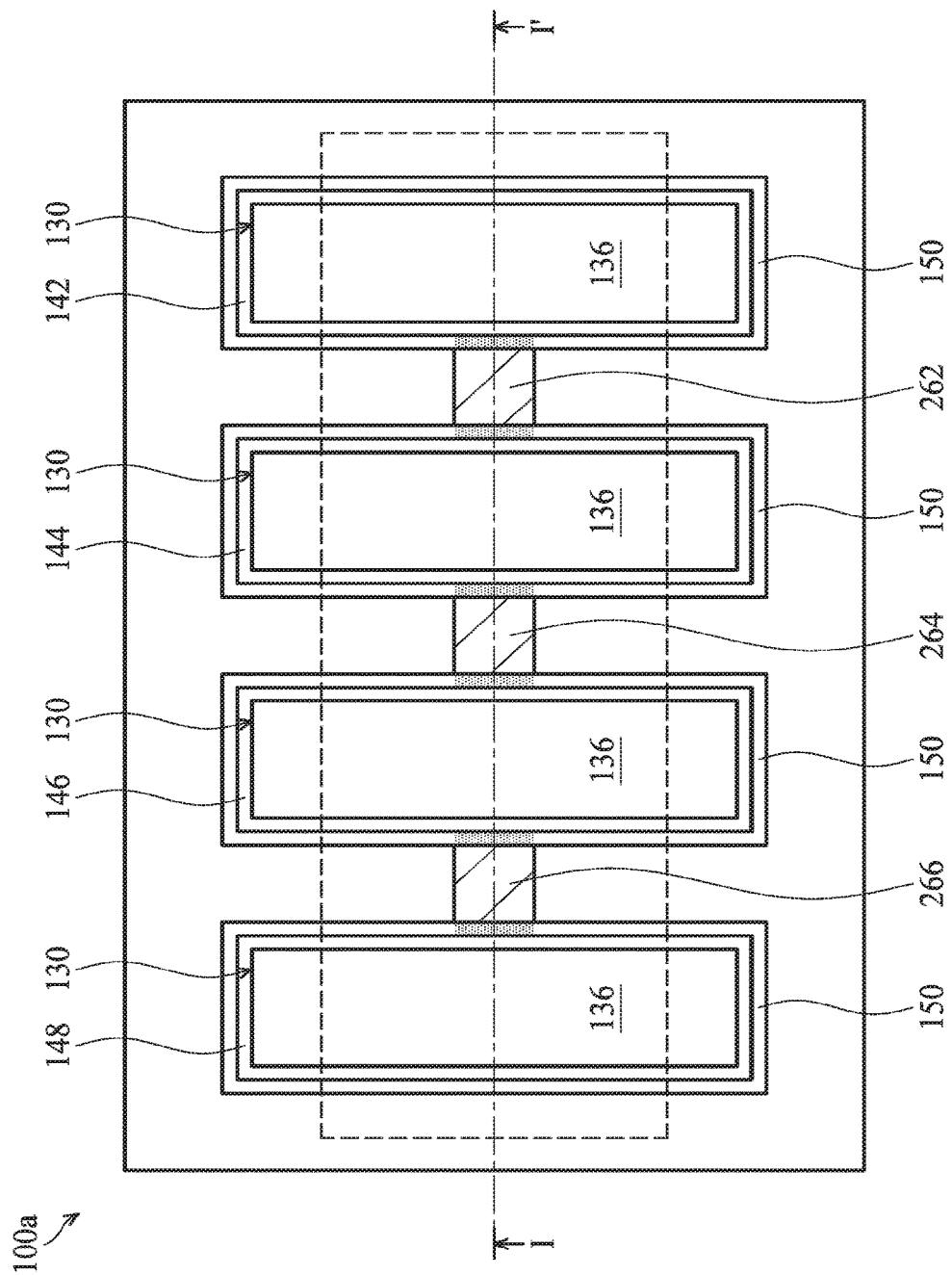
FIG. 2A is a top view of a semiconductor device structure, in accordance with some embodiments.
Figure 2B:
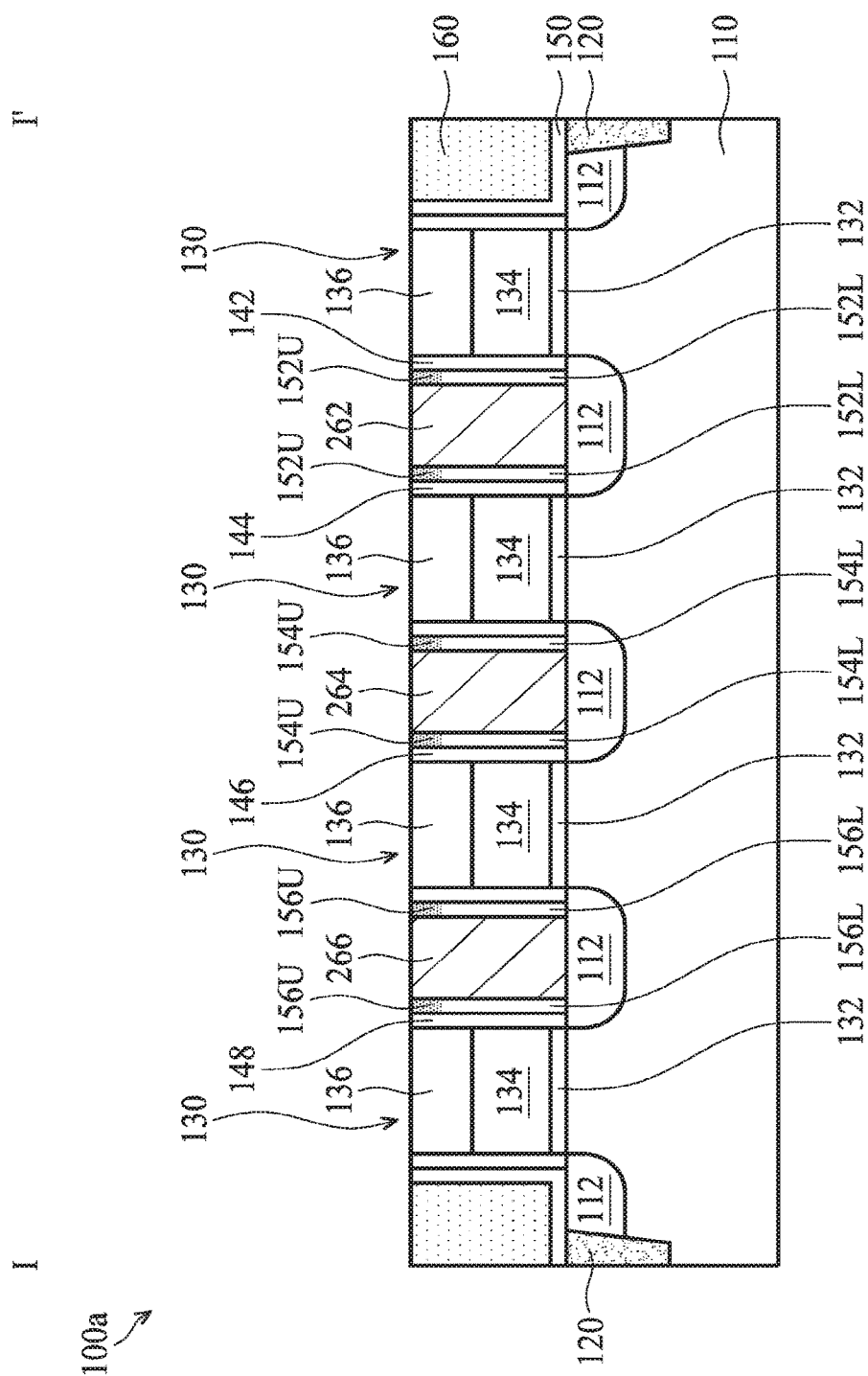
FIG. 2B is a cross-sectional view illustrating the semiconductor device structure along a sectional line I-I' in FIG. 2A, in accordance with some embodiments.

FIG. 2A is a top view of a semiconductor device structure 100a, in accordance with some embodiments. FIG. 2B is a cross-sectional view illustrating the semiconductor device structure 100a along a sectional line I-I' in FIG. 2A, in accordance with some embodiments.

As shown in FIGS. 2A and 2B, the semiconductor device structure 100a is similar to the semiconductor device structure 100 of FIG. 1N-1, except that the gate stacks 130 of the semiconductor device structure 100a are semiconductor gate stacks. The method for forming the semiconductor device structure 100a includes performing the steps of FIGS. 1A-1B and 1F-1N, in accordance with some embodiments.

In accordance with some embodiments, semiconductor device structures and methods for forming the same are provided. The methods (for forming the semiconductor device structure) form protection layers over a gate stack and a spacer layer before a contact hole etching process. Therefore, the methods prevent a gate electrode of the gate stack from shorting a conductive contact structure formed in a contact hole. As a result, the yield of the semiconductor device structure is improved.

In accordance with some embodiments, a method for forming a semiconductor device structure is provided. The method includes forming a gate stack, a spacer layer, and a dielectric layer over a substrate. The spacer layer surrounds the gate stack, and the dielectric layer surrounds the spacer layer. The method includes removing a first portion of the dielectric layer to form a first hole in the dielectric layer. The first hole is adjacent to the spacer layer, and a second portion of the dielectric layer is under the first hole. The method includes forming a first protection layer over the gate stack and the spacer layer. The method includes forming a second protection layer over the first protection layer. The second protection layer includes a metal compound material, and the first protection layer and the second protection layer includes a same metal element. The method includes removing the second portion of the dielectric layer to form a through hole. The method includes forming a conductive contact structure in the through hole.

In accordance with some embodiments, a method for forming a semiconductor device structure is provided. The method includes forming a gate stack, a spacer layer, and a dielectric layer over a substrate. The spacer layer surrounds the gate stack, and the dielectric layer surrounds the spacer layer. The method includes removing a first portion of the dielectric layer to form a first hole in the dielectric layer. The first hole is adjacent to the spacer layer, and a second portion of the dielectric layer is under the first hole. The method includes forming a first protection layer over the gate stack and the spacer layer. The method includes reacting the first protection layer with a silicon-containing gas to form a second protection layer over the first protection layer. The second protection layer includes a metal silicide material. The method includes removing the second portion of the dielectric layer to form a through hole. The method includes forming a conductive contact structure in the through hole.

In accordance with some embodiments, a semiconductor device structure is provided. The semiconductor device structure includes a substrate. The semiconductor device structure includes a gate stack over the substrate. The semiconductor device structure includes an etching stop layer over a sidewall of the gate stack. The semiconductor device structure includes a dielectric layer over the substrate and surrounding the gate stack. The semiconductor device structure includes a first conductive contact structure passing through the dielectric layer and adjacent to the etching stop layer. The etching stop layer adjacent to the first conductive contact structure has a first upper portion and a first lower portion. A first silicon concentration of the first upper portion is greater than a second silicon concentration of the first lower portion.

In accordance with some embodiments, a semiconductor device includes a substrate; a gate stack over the substrate; an etch stop layer on a first sidewall of the gate stack and on a second sidewall of the gate stack opposing the first sidewall; and a first conductive contact structure laterally adjacent to the gate stack, where the etch stop layer on the first sidewall is between the gate stack and the first conductive contact structure, where the etch stop layer on the first sidewall has a first upper portion and a first lower portion, and a first silicon concentration of the first upper portion is greater than a second silicon concentration of the first lower portion.

In accordance with some embodiments, a semiconductor device includes a gate stack; a spacer layer around the gate stack; an etch stop layer around the spacer layer, where the spacer layer is between the etch stop layer and the gate stack, and where a first composition of an upper portion of the etch stop layer is different from a second composition of a lower portion of the etch stop layer; and a contact structure laterally spaced from the gate stack.

In accordance with some embodiments, a semiconductor device includes a first gate stack over a substrate; a second gate stack over the substrate and laterally spaced apart from the first gate stack; a first etch stop layer over first sidewalls of the first gate stack, where a top portion of the first etch stop layer has a first concentration of silicon, and a lower portion of the first etch stop layer has a second concentration of silicon, where the first concentration of silicon is different from the second concentration of silicon; a second etch stop layer over second sidewalls of the second gate stack; and a contact structure between the first gate stack and the second gate stack, the contact structure extending from the first etch stop layer to the second etch stop layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
a substrate;
a gate stack over the substrate;
an etch stop layer on a first sidewall of the gate stack and on a second sidewall of the gate stack opposing the first sidewall; and
a first conductive contact structure laterally adjacent to the gate stack, wherein the etch stop layer on the first sidewall is between the gate stack and the first conductive contact structure, wherein the etch stop layer on the first sidewall has a first upper portion and a first lower portion, wherein each of the first upper portion and the first lower portion extends from a first side of the etch stop layer facing the gate stack to a second side of the etch stop layer opposing the first side, and wherein a first silicon concentration of the first upper portion is greater than a second silicon concentration of the first lower portion.

2. The semiconductor device of claim 1, further comprising source/drain regions on opposing sides of the gate stack, wherein the first conductive contact structure is electrically coupled to one of the source/drain regions.

3. The semiconductor device of claim 1, wherein the first conductive contact structure is in direct contact with the etch stop layer.

4. The semiconductor device of claim 1, further comprising a spacer layer surrounding the gate stack and between the etch stop layer and the gate stack.

5. The semiconductor device of claim 4, wherein the first silicon concentration of the first upper portion of the etch stop layer is greater than a third silicon concentration of the spacer layer.

6. The semiconductor device of claim 1, further comprising a second conductive contact structure on an opposing side of the gate stack from the first conductive contact structure, wherein the etch stop layer on the second sidewall is between the gate stack and the second conductive contact structure, wherein the etch stop layer on the second sidewall has an second upper portion and a second lower portion, and wherein a third silicon concentration of the second upper portion is greater than a fourth silicon concentration of the second lower portion.

7. The semiconductor device of claim 1, further comprising:
a dielectric material on an opposing side of the gate stack from the first conductive contact structure, wherein the etch stop layer on the second sidewall contacts the dielectric material, wherein the etch stop layer on the second sidewall is between the gate stack and the dielectric material, wherein the etch stop layer on the second sidewall has a second upper portion and a second lower portion, the second upper portion and the second lower portion having a same width as the etch stop layer, and wherein the second upper portion and the second lower portion have a same third silicon concentration smaller than the first silicon concentration.

8. The semiconductor device of claim 1, wherein the first upper portion has a first atomic ratio of silicon elements to nitrogen elements, and the first lower portion has a second atomic ratio of silicon elements to nitrogen elements, and wherein the first atomic ratio is larger than the second atomic ratio.

9. The semiconductor device of claim 1, wherein the gate stack comprises a gate dielectric layer over the substrate, a gate electrode over the gate dielectric layer, and a cap layer over the gate electrode.

10. The semiconductor device of claim 1, wherein the gate stack comprises:
a gate electrode;
a gate dielectric layer along sidewalls and a bottom of the gate electrode; and
a work function layer between the gate electrode and the gate dielectric layer.

11. The semiconductor device of claim 10, wherein the gate stack further comprises a cap layer over the gate electrode, wherein a first width between opposing sidewalls of the cap layer is equal to a second width between exterior sidewalls of the gate dielectric layer.

12. A semiconductor device comprising:
a gate stack;
a spacer layer around the gate stack;
an etch stop layer around the spacer layer, wherein the spacer layer is between the etch stop layer and the gate stack, and wherein a first composition of an upper portion of the etch stop layer is different from a second composition of a lower portion of the etch stop layer, wherein a width of the upper portion of the etch stop layer is equal to a thickness of the etch stop layer, and a width of the lower portion of the etch stop layer is equal to the thickness of the etch stop layer; and
a contact structure laterally spaced from the gate stack.

13. The semiconductor device of claim 12, wherein the upper portion of the etch stop layer has a first silicon concentration that is larger than a second silicon concentration of the lower portion of the etch stop layer.

14. The semiconductor device of claim 12, wherein the upper portion of the etch stop layer has a first atomic ratio of silicon elements to nitrogen elements, and the lower portion of the etch stop layer has a second atomic ratio of silicon elements to nitrogen elements, and wherein the first atomic ratio is larger than the second atomic ratio.

15. The semiconductor device of claim 12, wherein the gate stack comprises:
a gate dielectric layer;
a gate electrode over at least a portion of the gate dielectric layer; and
a cap layer over the gate electrode and the gate dielectric layer, wherein sidewalls of the cap layer contact interior sidewalls of the spacer layer, and sidewalls of the gate dielectric layer contact the interior sidewalls of the spacer layer.

16. A semiconductor device comprising:
a first gate stack over a substrate;
a second gate stack over the substrate and laterally spaced apart from the first gate stack;
a first etch stop layer along first sidewalls of the first gate stack, wherein a top portion of the first etch stop layer has a first concentration of silicon, and a lower portion of the first etch stop layer has a second concentration of silicon, wherein the top portion is directly over the lower portion, wherein the first concentration of silicon is different from the second concentration of silicon;
a second etch stop layer along second sidewalls of the second gate stack; and
a contact structure between the first gate stack and the second gate stack, the contact structure extending from the first etch stop layer to the second etch stop layer.

17. The semiconductor device of claim 16, wherein the first concentration of silicon is larger than the second concentration of silicon.

18. The semiconductor device of claim 16, wherein the contact structure is electrically coupled to a source/drain region between the first gate stack and the second gate stack.

19. The semiconductor device of claim 16, wherein the first gate stack comprises a first gate electrode and a first cap layer over the first gate electrode, the second gate stack comprises a second gate electrode and a second cap layer over the second gate electrode, the first cap layer and the second cap layer being made of a dielectric material, and wherein the top portion of the first etch stop layer is between the first cap layer and the second cap layer.

20. The semiconductor device of claim 16, wherein the first etch stop layer comprises silicon nitride, wherein the top portion of the first etch stop layer has a first atomic ratio of silicon to nitrogen, and the lower portion of the first etch stop layer has a second atomic ratio of silicon to nitrogen, the first atomic ratio being larger than the second atomic ratio.

* * * * *